(12) United States Patent
Watanabe et al.

(10) Patent No.: US 7,126,127 B2
(45) Date of Patent: Oct. 24, 2006

(54) IMAGE PICK-UP APPARATUS AND MANUFACTURING METHOD THEREOF, RADIATION IMAGE PICK-UP APPARATUS, AND RADIATION IMAGE PICK-UP SYSTEM

(75) Inventors: Minoru Watanabe, Saitama (JP);
Masakazu Morishita, Kanagawa (JP);
Chiori Mochizuki, Kanagawa (JP);
Keiichi Nomura, Saitama (JP);
Takamasa Ishii, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 18 days.

(21) Appl. No.: 10/954,194

(22) Filed: Oct. 1, 2004

(65) Prior Publication Data

US 2005/0263709 A1   Dec. 1, 2005

(30) Foreign Application Priority Data

Oct. 2, 2003   (JP)   ............................. 2003-344560
Jun. 14, 2004   (JP)   ............................. 2004-175558

(51) Int. Cl.
*G01T 1/24* (2006.01)

(52) U.S. Cl. ............................. 250/370.01; 250/370.11; 257/59; 257/444

(58) Field of Classification Search ........... 250/370.11, 250/370.01; 257/444, 59
See application file for complete search history.

(56) References Cited

U.S. PATENT DOCUMENTS

| 4,857,751 | A | 8/1989 | Hatanaka et al. ............ 250/578 |
| 5,073,828 | A | 12/1991 | Yamada et al. .............. 358/482 |
| 5,283,428 | A | 2/1994 | Morishita et al. ......... 250/214.1 |
| 5,352,920 | A | 10/1994 | Morishita et al. ............ 257/435 |
| 5,498,880 | A | 3/1996 | Lee et al. ..................... 250/580 |
| 5,567,956 | A | 10/1996 | Yamanobe et al. ............ 257/55 |
| 5,583,361 | A | 12/1996 | Morishita .................... 257/345 |
| 5,619,033 | A | 4/1997 | Weisfield ..................... 250/208 |
| 5,680,229 | A | 10/1997 | Yamanobe et al. ......... 358/482 |
| 6,115,090 | A * | 9/2000 | Yamazaki ..................... 349/42 |
| 6,229,877 | B1 * | 5/2001 | Agano ......................... 378/154 |
| 6,295,142 | B1 | 9/2001 | Watanabe et al. ........... 358/482 |
| 6,600,158 | B1 | 7/2003 | Okada et al. .......... 250/370.11 |
| 6,623,990 | B1 | 9/2003 | Watanabe et al. .............. 438/4 |
| 6,797,961 | B1 * | 9/2004 | Choo et al. ............. 250/370.09 |
| 2002/0027974 | A1 * | 3/2002 | Ezaki et al. ................. 378/145 |
| 2002/0076861 | A1 * | 6/2002 | Kwon ......................... 438/149 |
| 2004/0223587 | A1 * | 11/2004 | Tsujii ........................... 378/97 |

* cited by examiner

*Primary Examiner*—Renee Luebke
*Assistant Examiner*—Mary Zettl
(74) *Attorney, Agent, or Firm*—Fitzpatrick, Cella, Harper & Scinto

(57) ABSTRACT

In an image pick-up apparatus, a plurality of pixels, each pairing a semiconductor conversion element for converting an incident electromagnetic wave to an electric signal and a thin film transistor connected to the semiconductor conversion element, is arranged in a two-dimensional state on a substrate. The image pick-up apparatus includes gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on the substrate. Protection layers are arranged on the thin film transistors, the gate wiring and the signal wiring. The protection layers formed at least at the same time. Then, the protection layers are removed in at least a part or all of regions in which the semiconductor conversion elements are formed.

7 Claims, 17 Drawing Sheets

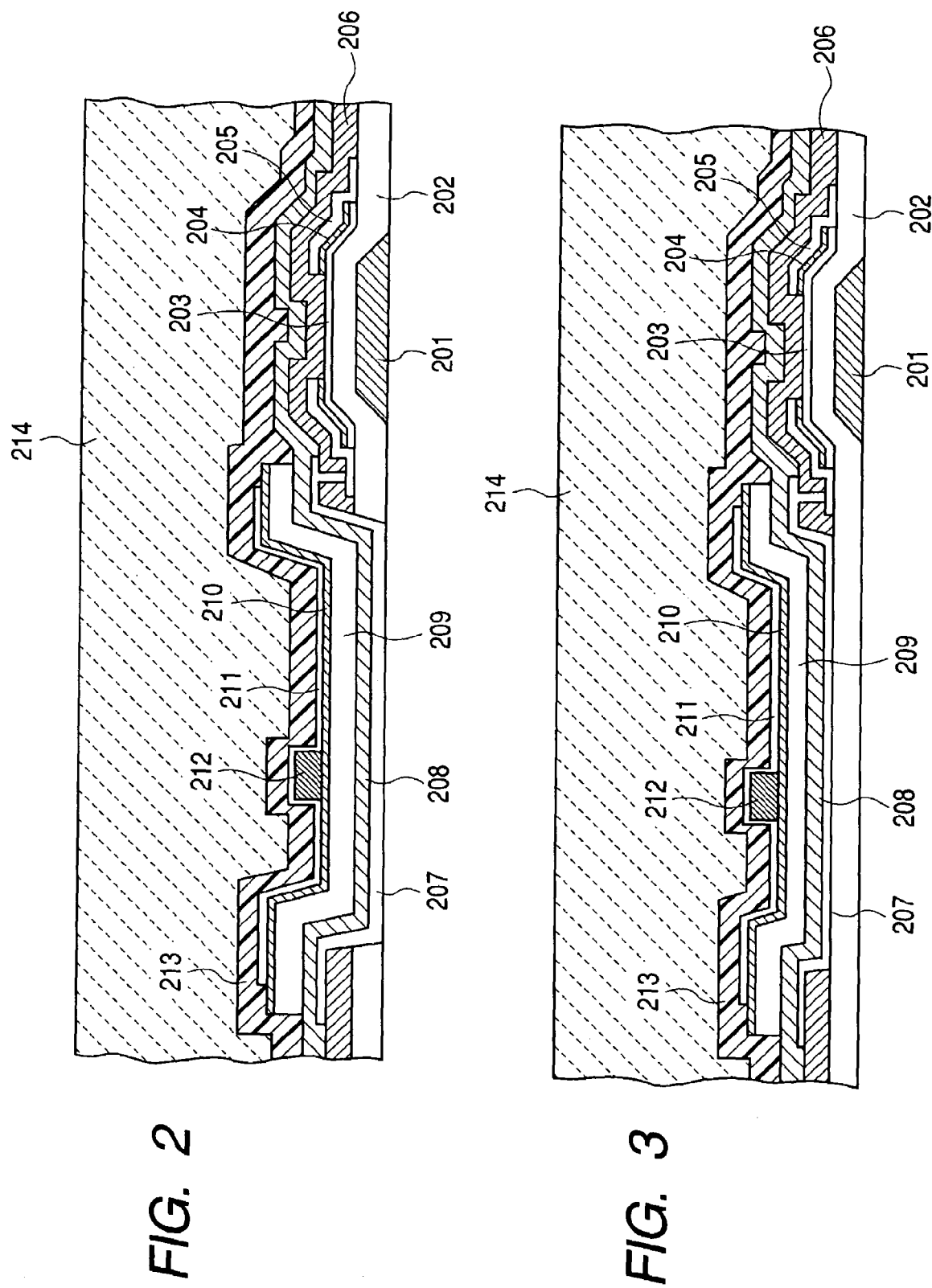

IMAGE PICK-UP APPARATUS AND MANUFACTURING METHOD THEREOF, RADIATION IMAGE PICK-UP APPARATUS, AND RADIATION IMAGE PICK-UP SYSTEM

BACKGROUND OF THE INVENTION

1. Field of the Invention

The present invention relates to an image pick-up apparatus including thin film transistors (TFT's) and semiconductor conversion elements and a manufacturing method thereof, a radiation image pick-up apparatus, and a radiation image pick-up system.

2. Description of Related Art

Recently, the enlargement of the size of a TFT matrix panel, in which TFT's are formed on an insulating substrate, and the speeding-up of the drive speed of the panel have been rapidly promoted. Manufacturing methods of liquid crystal panels using thin film transistors (TFT's) are utilized as area sensors including semiconductor conversion elements for converting radiations such as X-rays to electric signals (for example, a radiation image pick-up apparatus). As such a semiconductor conversion element, for example, there is a conversion element in which a wavelength conversion layer (e.g., a phosphor layer) for performing a wavelength conversion from a radiation such as an X-ray to light such as visible light is arranged on the surface of the conversion element for performing the photoelectric conversion of the light. Another conversion element uses a semiconductor converting material for converting a radiation to an electric signal directly.

In a substrate arranging such semiconductor conversion elements and TFT's for reading out electric signals from the semiconductor conversion elements two-dimensionally thereon for reading the amount of irradiation of radiations, a radiation image pick-up apparatus having a high sensitivity can be provided by detecting a larger amount of a radiation or the light converted from the radiation which is irradiated to each pixel. For the sake of that, it is needed to arrange the conversion elements using the whole space effectively while keeping the performances of the TFT's.

Accordingly, a method of forming a TFT array before stacking conversion elements on the TFT array for improving the sensitivity thereof by preventing the loss of open area ratios of TFT's has been conventionally proposed. As an example, U.S. Pat. No. 5,498,880 discloses an arrangement of conversion elements above TFT's. A schematic sectional view of the prior art is shown in FIG. 20. FIG. 20 shows a configuration in which two pixels are laid side by side. One pixel is composed of a TFT 5 on the lower left side, a capacitor portion 6 on the lower right side, and a conversion element arranged thereon. The top surface of the TFT 5 is covered by an insulating layer 98 to remove unnecessary regions. By arranging the conversion element above the insulating layer, the prior art improves the open area ratio greatly.

However, the achievement of increasing the amount of signals, namely the reduction of the amount of noises, is needed together with the improvement of the open area ratio for improving the sensitivity. In other words, when noise components increase, an S/N ratio does not increase even if signal components are improved. The situation cannot be said that the actual sensitivity is improved.

FIG. 21 is a simplified equivalent circuit diagram showing the plane configuration of the example shown in the U.S. Pat. No. 5,498,880.

A charge capturing electrode 3n is not arranged on gate wiring 11 and signal wiring 13. Because the insulating film 98 is formed at the inside of the electrode 3n as shown in FIG. 20, it is known that the insulating film 98 is not formed on the gate wiring and the signal wiring.

When a capacitance applied to signal wiring and gate wiring becomes larger, the noises of an image to be taken in become larger in a radiation image pick-up apparatus. Accordingly, it becomes important to decrease the parasitic capacitance applied to both the wiring. In the example of the above-mentioned U.S. Pat. No. 5,498,880, the insulating layer 98 does not cover the gate wiring and the signal wiring, and consequently no measures for the parasitic capacitance of the signal wiring concerning noise components are considered. As a result, though the improvement of signal components owing to the improvement of the open area ratio can be recognized, noises are not considered, and consequently the sensitivity regarded as the S/N ratio is estimated to be insufficient.

SUMMARY OF THE INVENTION

The present invention was made in view of the above-mentioned problems, and aims to achieve the improvement of the sensitivity of a radiation image pick-up apparatus and the reduction of noises thereof by decreasing the parasitic capacitance on signal wiring and gate wiring.

In an image pick-up apparatus of the present invention, a plurality of pixels, each comprising a pair of a semiconductor conversion element for converting an incident electromagnetic wave to an electric signal and a thin film transistor connected to the semiconductor conversion element, is arranged in a two-dimensional manner on a substrate, the image pick-up apparatus including gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on the substrate, wherein a protection layer is are arranged so as to cover the thin film transistors, the gate wiring and the signal wiring, and the protection layer is removed from at least a part of or whole of the region in which a through hole and the semiconductor conversion element are formed.

A radiation image pick-up apparatus of the present invention includes an image pick-up apparatus of the present invention, wherein the semiconductor conversion elements of the image pick-up apparatus are photoelectric conversion elements, and the electromagnetic wave is a radiation, and the radiation image pick-up apparatus includes wavelength conversion layers for converting the radiation to light having a wavelength in a wavelength region in which the light can be photoelectrically converted by the photoelectric conversion elements, the wavelength conversion layers formed on the photoelectric conversion elements severally.

Moreover, in a radiation image pick-up apparatus of the present invention, the semiconductor conversion elements of the image pick-up apparatus of the present invention are elements for converting a radiation to an electric signal directly, and the electromagnetic waver is the radiation.

A manufacturing method of an image pick-up apparatus of the present invention is a manufacturing method of an image pick-up apparatus in which a plurality of pixels, each comprising a pair of a semiconductor conversion elements for converting an incident electromagnetic wave to an electric signal and a thin film transistor connected to the semiconductor conversion element, is arranged in a two-dimensional manner on a substrate, the image pick-up apparatus including gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on the substrate, the method comprising the steps of: forming a conductive layer for the gate electrodes of the thin film transistors and the gate wiring on the substrate; patterning the conductive layer to form the gate electrodes of the thin film transistors and the gate wiring; forming a conductive film for the source electrodes and the drain electrodes of the thin film transistors and the signal wiring after forming an insulating layer and a semiconductor layer above the substrate; patterning of the conductive film to form the source electrodes and the drain electrodes of the thin film transistors and signal wiring; forming a protection layer above the substrate, the protection layer arranged above the thin film transistors, the gate wiring and the signal wiring; patterning the protection layer in order to remove the protection layer in at least a part or the whole region in which the semiconductor conversion elements are formed; and forming the semiconductor conversion elements in regions in which the protection layer is removed and on a part of the protection layer, or in the regions in which the protection layer is removed.

Moreover, a radiation image pick-up system of the present invention includes a radiation image pick-up apparatus of the present invention; a signal processing unit for processing a signal from the radiation image pick-up apparatus; a recording unit for recording a signal from the signal processing unit; a display unit for displaying the signal from the signal processing unit; a transmission processing unit for transmitting the signal from the signal processing unit; and a radiation source for generating a radiation.

The present invention uses a configuration in which semiconductor conversion elements and TFT's are connected with each other through interlayer insulating films. The TFT's, signal wiring and gate wiring are covered by protection layers such as the interlayer insulating films, and thereby parasitic capacitance applied to each wiring is reduced, and noises are reduced. Consequently, the sensitivity considered from the viewpoint of S/N is improved.

Moreover, the protection layer desirably has a fixed thickness (e.g. 2000 Å) or more for reducing the capacitance applied to the signal wiring and the gate wiring. However, when the film thickness is thick, a glass warps owing to a stress, and the image pick-up apparatus cannot be conveyed by a manufacturing apparatus. Accordingly, as described above, by removing at least a part of a region of a semiconductor conversion element, which is an unnecessary region as an insulating layer, the film thickness of the protection layer can be thickened, and it can be achieve to reduce the capacitance applied to the signal wiring and gate wiring. In particular, by thickening the film thickness of the protection layer to be very thick, it becomes possible to suppress the capacitance formed between the semiconductor conversion element and the signal wiring or the gate wiring even if the semiconductor conversion element is arranged immediately on the signal wiring and the gate wiring.

In the present application, it is supposed that the electromagnetic wave includes ones in a wavelength region from light such as visible light and infrared light to a radiation such as an X-ray, an ray, a ray, a ray and the like.

According to the present invention, the parasitic capacitance of signal wiring and gate wiring is reduced while improving the open area ratio of a semiconductor conversion element. Thereby, the improvement of the sensitivity and the reduction of noises of a radiation image pick-up apparatus can be achieved.

Moreover, the warp of a substrate owing to the stress relaxation of a film is prevented to enable the achievement of stable manufacturing.

Other features and advantages of the present invention will be apparent from the following description taken in conjunction with the accompanying drawings, in which same or similar reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a sectional view taken along a line 2—2 in FIG. 1, showing an example using an MIS type semiconductor conversion element in case of removing a protection layer and a gate insulating layer for stress relaxation;

FIG. 3 is a sectional view taken along the line 2—2 in FIG. 1, showing an example using the MIS type semiconductor conversion element in case of removing only the protection layer for stress relaxation;

DETAILED DESCRIPTION OF THE PREFERRED EMBODIMENTS

In the following, the attached drawings are referred to while the preferred embodiments of the present invention are described in detail. In the following embodiments, description is given to a case where a radiation image pick-up apparatus is configured, but the image pick-up apparatus of the present invention is not limited to the radiation image pick-up apparatus converting radiations to electric signals, and the present invention can be also applied to an image pick-up apparatus converting light such as visible light and infrared light to electric signals.

(First Embodiment)

First, a first embodiment of the present invention is described.

Figure 1:
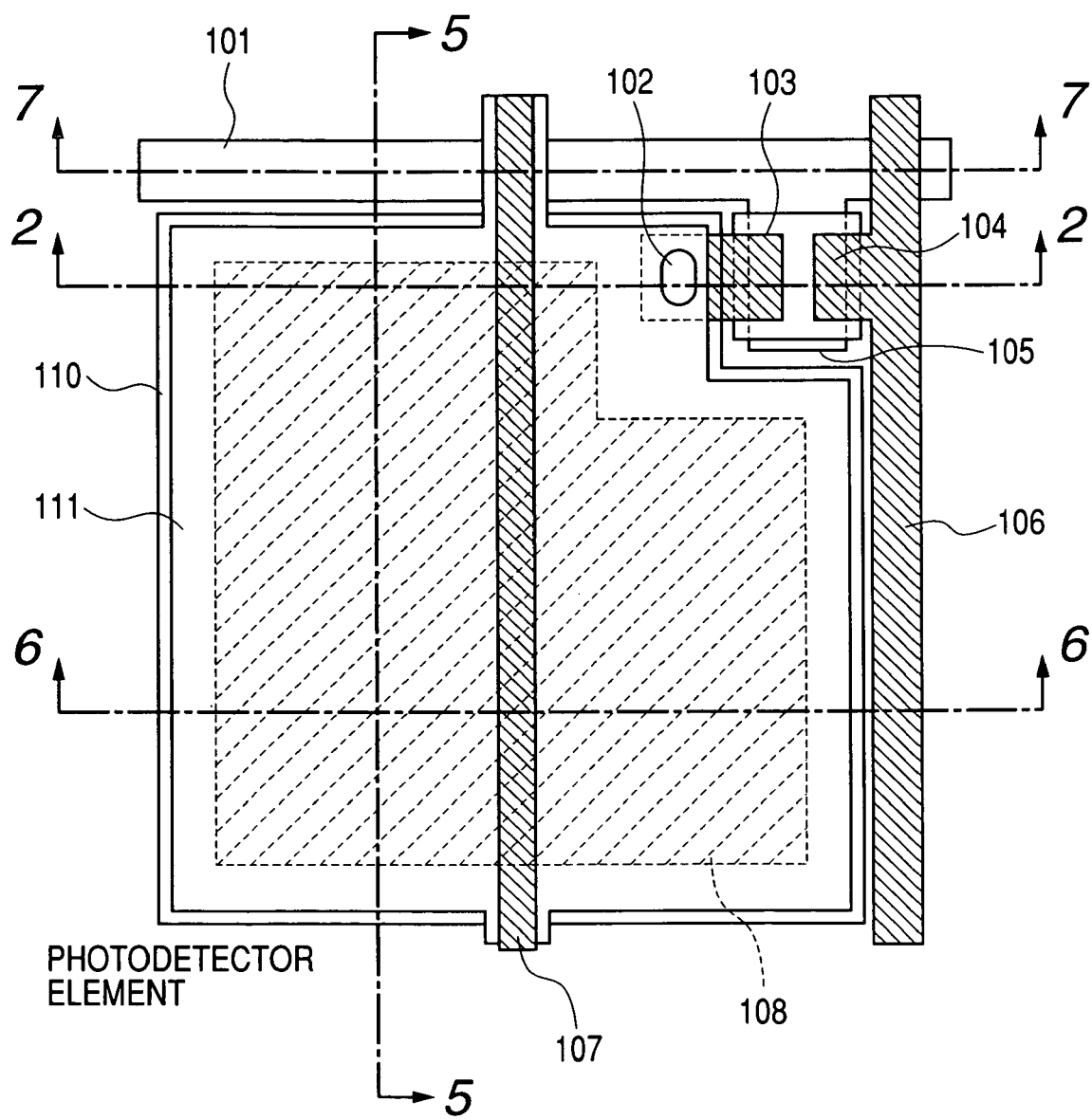
FIG. 1 is a plan view of a pixel according to a first embodiment of the present invention.
Figure 4:
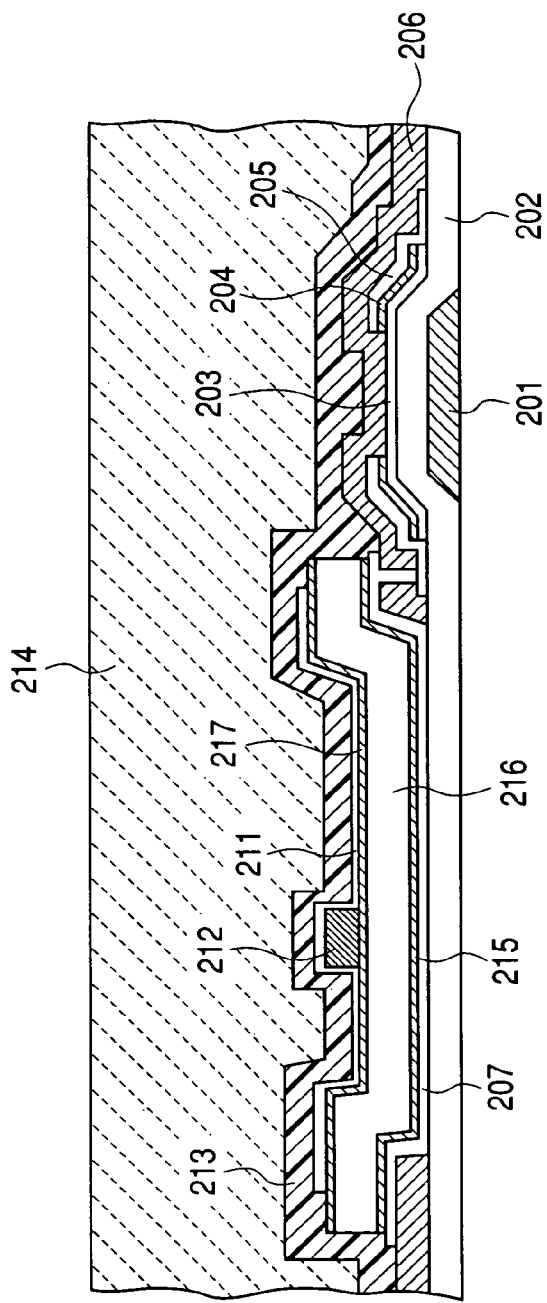
FIG. 4 is a sectional view taken along the line 2—2 in FIG. 1, showing an example using a PIN type semiconductor conversion element in case of removing only a protection layer for stress relaxation.
Figure 5:
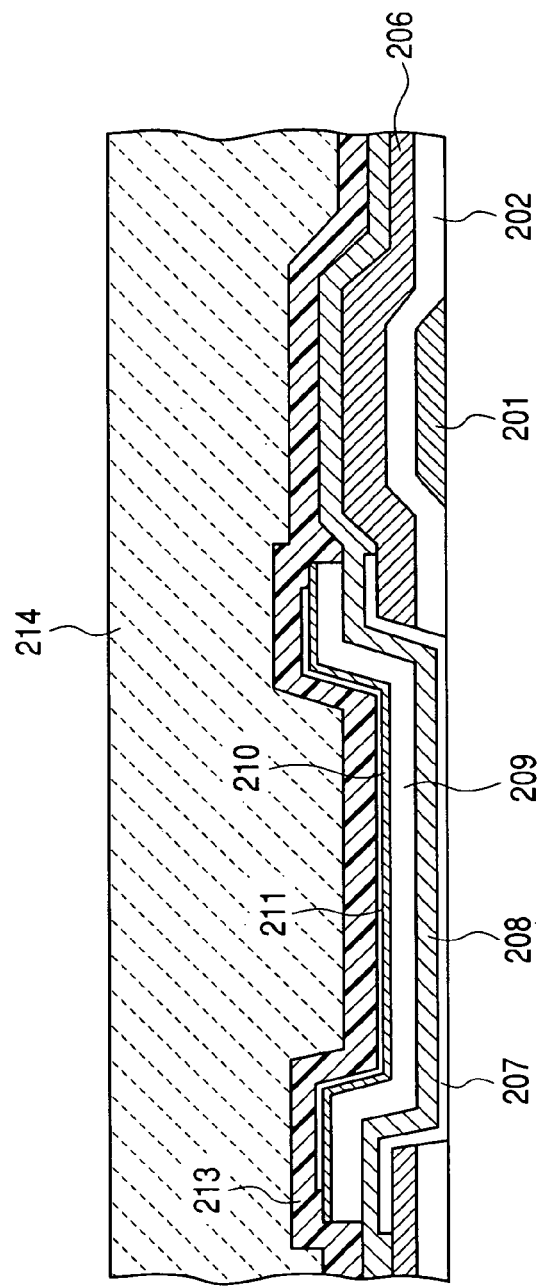
FIG. 5 is a sectional view taken along a line 5—5 in FIG. 1, showing an example corresponding to the sectional view of FIG. 2.
Figure 6:
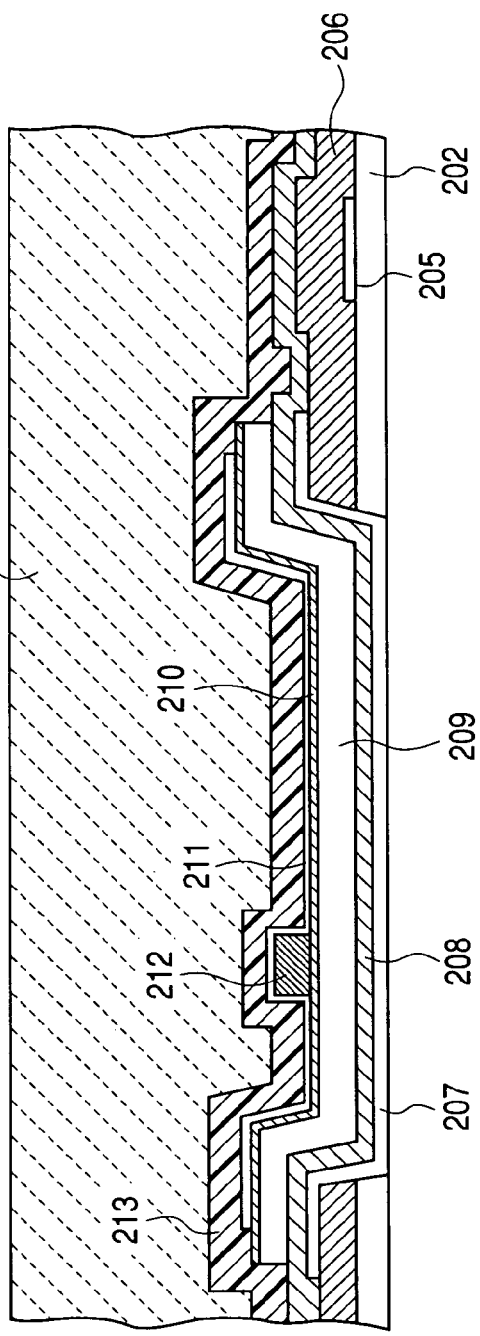
FIG. 6 is a sectional view taken along a line 6—6 in FIG. 1, showing an example corresponding to the sectional view of FIG. 2.
Figure 7:
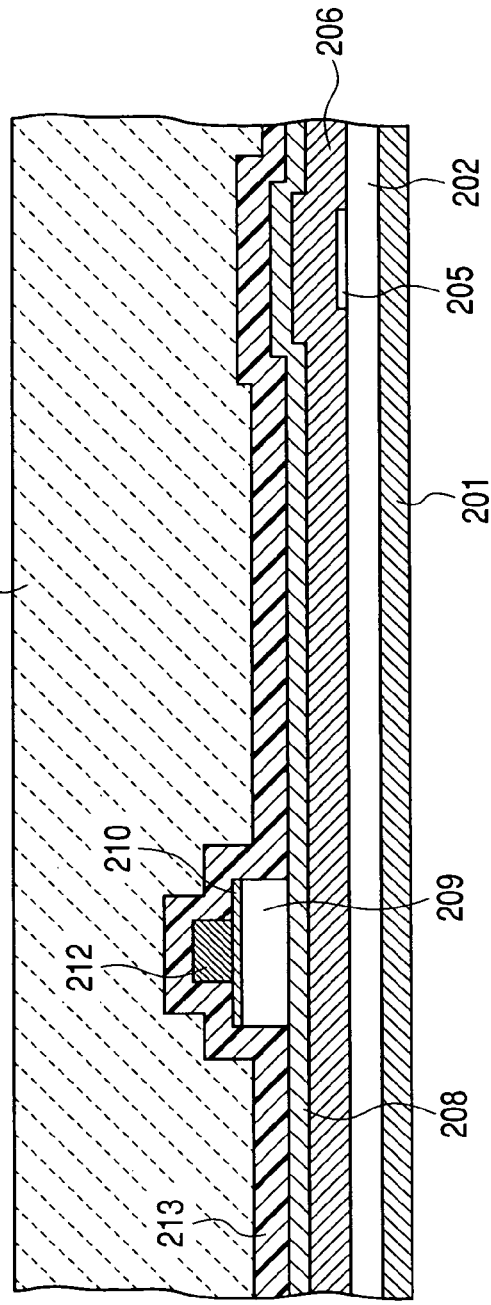
FIG. 7 is a sectional view taken along a line 7—7 in FIG. 1, showing an example corresponding to the sectional view of FIG. 2.

FIGS. 1–7 show a plan view and sectional views of a pixel of the first embodiment according to the present invention. FIG. 1 is the plan view of the pixel according to the first embodiment of the present invention. FIG. 2 is a sectional view taken along a line 2—2 in FIG. 1, showing an example using an MIS type semiconductor conversion element in case of removing a protection layer and a gate insulating layer for stress relaxation. FIG. 3 is a sectional view taken along the line 2—2 in FIG. 1, showing an example using the MIS type semiconductor conversion element in case of removing only the protection layer for stress relaxation. FIG. 4 is a sectional view taken along the line 2—2 in FIG. 1, showing an example using a PIN type semiconductor conversion element in case of removing only a protection layer for stress relaxation. FIG. 5 is a sectional view taken along a line 5—5 in FIG. 1. FIG. 6 is a sectional view taken along a line 6—6 in FIG. 1. FIG. 7 is a sectional view taken along a line 7—7 in FIG. 1.

FIG. 1 is a layout view showing a plane configuration of a pixel in which a semiconductor conversion element converting an electromagnetic wave to an electric signal and a thin film transistor (TFT) are paired in a radiation image pick-up apparatus according to the first embodiment of the present invention.

The semiconductor conversion element of the present embodiment is a semiconductor device for converting an electromagnetic wave including light such as visible light and infrared light, and a radiation such as an X-ray, an α ray, a β ray and a γ ray to an electric signal. The semiconductor conversion element does not directly convert any radiations such as the X-ray. When a photoelectric conversion element for converting light such as visible light to an electric signal is used, a phosphor layer as a wavelength conversion layer for converting a radiation to light such as visible light capable of being photoelectrically converted by the photoelectric conversion element is arranged on the photoelectric conversion element.

Figure 8:
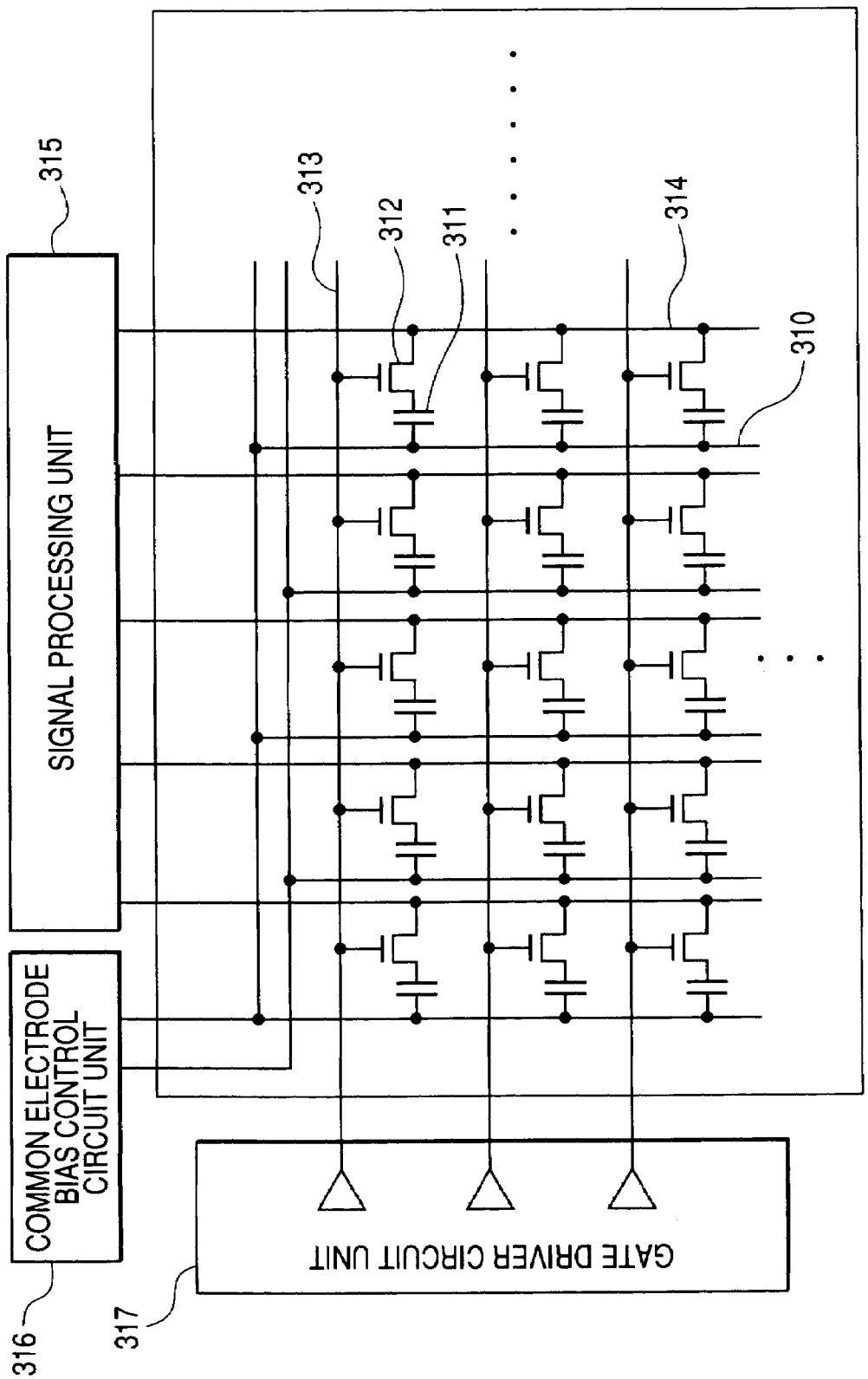
FIG. 8 is an image diagram of a simplified equivalent circuit diagram of a radiation image pick-up apparatus according to the first embodiment of the present invention and peripheral circuitry thereof.

The thin film transistor (TFT) includes three electrodes of a source electrode 104, a drain electrode 103 and a gate electrode 105. Signal wiring 106 connected to a signal processing circuit unit for reading stored charges to process the read charges is connected to the source electrode 104 of the TFT. Moreover, gate wiring 101 connected to a gate driver circuit unit for controlling the turning on and off of the TFT is connected to the gate electrode 105 of the TFT. As shown in FIG. 8, pixels are arranged in a two-dimension state. The signal wiring 106 is commonly connected to source electrodes of the TFT's of pixels arranged in column directions, and the gate wiring 101 is commonly connected to the gate electrodes of the TFT's arranged in row directions. The gate wiring 101 is formed to a pattern at the same layer as that of the gate electrodes 105 at the same time. Moreover, the signal wiring 106 is formed to a pattern at the same layer as that of the source electrodes 104 of the TFT's at the same time. In FIG. 1, a reference numeral 110 denotes a lower electrode (corresponding to a third electrode layer 207 in FIG. 2) of the semiconductor conversion element, and a reference numeral 111 denotes a light receiving portion (corresponding to a second high resistor semiconductor layer 209 in FIG. 2) of the semiconductor conversion element.

A reference numeral 107 denotes bias wiring (corresponding to a fourth electrode layer 212 in FIG. 2), and the bias wiring 107 applies a bias voltage to the photoelectric conversion element. A reference numeral 102 denotes a through hole.

As the photoelectric conversion element, an MIS type semiconductor conversion element composed of a metal layer (lower electrode layer), an insulating film, a high resistance semiconductor layer, an ohmic contact layer and a transparent electrode layer (upper electrode layer; the ohmic contact layer is also used as the electrode layer in the case where the transparent electrode layer is not provided) can be used. The lower electrode layer between the two electrodes constituting the photoelectric conversion layer is connected to the drain electrode of the TFT, and the upper electrode layer of the two electrodes is connected to the bias wiring for applying a voltage to the photoelectric conversion element. The photoelectric conversion element may be a PIN type semiconductor conversion element composed of an n-type semiconductor layer, a high resistance semiconductor layer and a p-type semiconductor layer. In the figure, the photoelectric conversion element is not arranged above the signal wiring and the gate wiring, but the photoelectric conversion element may be arranged above the signal wiring and the gate wiring in the case where the dielectric constant of the protection layer is small and the film thickness is thick, or the like. Moreover, the situation is the same as to the TFT, too. As long as no influences are exerted on the operation characteristics of the TFT, the photoelectric conversions element may be arranged to cover the TFT. Above such a photoelectric conversion element, a wavelength conversion layer such as the phosphor layer, for example a phosphor layer such as $Gd_2O_2S$ and CsI for converting an X-ray to visible light is arranged.

As a direct conversion type semiconductor conversion element, a direct conversion element such as amorphous selenium and lead iodide for directly converting a radiation to an electric signal can be used. Such a direct conversion element does not need to arrange a phosphor layer thereon.

Because the present figure shows a bottom gate type TFT, the ohmic contact layer and the high resistance semiconductor layer of the TFT is patterned, and only the gate insulating layer is left. Consequently, the gate insulating layer of the TFT is totally left above the gate wiring and below the signal wiring. In case of a top gate type TFT, there is the case where the gate wiring and the signal wiring are reversely arranged.

Moreover, the protection layer covering the TFT covers the whole signal wiring and the gate wiring, and is removed at the through hole portion and the inside of the semiconductor conversion element. A reference numeral 108 denotes an etching removing region of the protection layer.

Consequently, not only the TFT can be covered by the protection layer, but also the signal wiring and the gate wiring can be covered. Thereby, parasitic capacitance of each wiring can be relaxed, and consequently a radiation image pick-up apparatus having small amount of noises can be provided.

Moreover, the removal of the unnecessary protection layer also has advantages of preventing the warping of a substrate owing to a film stress to cause a conveyance trouble and an absorption trouble of the substrate in a manufacturing process.

In the figure, the whole removal part of the protection layer is within the inside of the semiconductor conversion element. The removal part may protrude to the outside of the semiconductor conversion element as long as the protection layer covers the TFT, the signal wiring and the gate wiring and has no problems on its function.

FIG. 2 is a sectional view taken along a 2—2 line in FIG. 1. The left half of the figure shows a semiconductor conversion element, and the right half of the figure shows a TFT.

The semiconductor in the left half is the MIS type semiconductor conversion element composed of the third electrode layer 207, a third insulating layer 208, the second high resistance semiconductor layer 209, a second n-type semiconductor layer 210 being an ohmic contact layer, and a transparent electrode layer 211. The semiconductor conversion element can perform the photoelectric conversion of light such as visible light. The transparent electrode layer (a fifth electrode) 211 composed of, for example, ITO is arranged on the ohmic contact layer 210. When the resistance of the ohmic contact layer is low, the ohmic contact layer can be also used as an electrode layer. A reference numeral 211 denotes a bias wiring layer. The ITO 211 covers the bias wiring layer 212 here, but the ITO 211 may be arranged under the bias wiring 212 (so with the embodiment described later). The third electrode layer 207 is a lower electrode layer, and is arranged astride at least a part of the second insulating layer (protection layer) and a region from which the second insulating layer (protection layer) is removed (in the region in which the semiconductor conversion element is formed). The end of the third electrode layer 207 is arranged on the second insulating layer (protection layer).

The protection layer composed of the second insulating layer 206 under the third electrode layer 207 of the semiconductor conversion element with an object of preventing the warping of the substrate owing to the film stress resulting from the enlargement of the film thickness of the semiconductor conversion element unit. At this time, the gate insulating layer of the TFT of the first insulating layer 202 is removed at the same time for performing further stress relaxation.

The thin film transistor (TFT) in the right half is composed of a first electrode layer 201 being the gate electrode, a first insulating layer 202 being the gate insulating layer, a first high resistance semiconductor layer 203 made of amorphous silicon, polysilicon or the like, a first n-type semiconductor layer 204 being an ohmic contact layer, and a second electrode layer 205 being a source layer and a drain layer.

The first insulating layer 202 and the second insulating layer 206 may be made of SiNx film or SiON film. However, in case of forming the first insulating layer 202 with, for example, an $SiO_2$ film, the $SiO_2$ film has a small dielectric constant, and the parasitic capacitance generated on the signal wiring and the gate wiring can be made to be small. Moreover, because the parasitic capacitance can be made to be small by stacking the second insulating layer 206 to be thick, it is preferable to be able to stack the second insulating layer 206 to be or more than, for example, 2000 in thickness.

In the case where the first insulating layer 202 and the second insulating layer 206 is formed of the $SiO_2$ film, the etching process for removing the first insulating layer 202 is preferably performed by using the wet etching process using dilute fluorinated acid or buffered fluorinated acid. In this case, it is preferable to form a metal layer of Mo, Cr or the like, which is not removed by the dilute fluorinated acid and the buffered fluorinated acid, on at least the surface of, for example, the through hole portion for the use of an etching stopper layer. Moreover, when the first insulating layer 202 and the second insulating layer 206 are removed at the same time, it is preferable to arrange an electrode layer on the glass surface at the position where the protection layer is removed for using the electrode layer as an etching stopper layer at the time of etching with the dilute fluorinated acid or the buffered fluorinated acid. The metal layer is formed at the same time as that of the gate electrode being the first electrode by using a metal layer of Mo or Cr, a multilayer film of those metal layers, or an alloy having the principal components of those metal layers.

FIG. 3 is similarly a sectional view taken at the line 2—2 in FIG. 1, showing another example different from FIG. 2. When the stress of the protection layer composed of the second insulating layer 206 is highly problematic, the problem can be solved by etching only the second insulating layer 206. At this time, for example, in the case where SiNx is used as the second insulating layer 206 and an $SiO_2$ film or an SiON film, each having an arbitrary thickness, is formed on at least the surface of the gate insulating layer made of the first insulating layer 202, a selection ratio can be made to be large by etching the second insulating layer 206 by using, for example, a dry etching process, and consequently only the second insulating layer 206 can be etched. Moreover, in the case where an electrode layer is formed at the same time as that the formation of the second electrode layer 205 on the surface of the first insulating layer 202 at the position where the second insulating layer 206 is removed, the metal layer operates as an etching stopper layer, which operation is preferable. In this case, it is preferable to use a material (metal) such as the film of Ti, Ta, Mo, Cr, Al or AlNd, which is easy to set a large selection ratio at the dry etching process, as the second electrode layer.

Moreover, the second electrode layer is a multilayer film of those material layers or an alloy having the main component of those material layers.

In this case, the stress of the film is little larger than that of the configuration of FIG. 2, but the height of getting over the step of the semiconductor conversion element is smaller. Consequently, the semiconductor conversion element can be simply manufactured.

FIG. 4 is similarly a sectional view taken along the 2—2 line in FIG. 2, and is a sectional view of a semiconductor conversion element in the left part being a PIN type semiconductor conversion element including a second n-type semiconductor layer 215, a second high resistance semiconductor layer 216 and a p-type semiconductor layer 217.

So with the PIN type semiconductor conversion element, it is possible to the p-type semiconductor layer and the n-type semiconductor layer can be also used as an electrode when their resistances are low.

FIG. 5 is a sectional view taken along a 6—6 line in FIG. 1, showing an example corresponding to the sectional view of FIG. 2. The lower electrode of the semiconductor conversion element is arranged to run on the first and the second insulating layers 202 and 206. The gate wiring aims to lower the parasitic capacity to be covered by the first, the second, the third and the fourth insulating layers 202, 206, 208 and 213.

FIG. 6 is a sectional view taken along the line 6—6 in FIG. 1, showing an example corresponding to the sectional view of FIG. 2. The lower electrode layer of the semiconductor conversion element composed of the third electrode 207 is arranged to run on the first and the second insulating layers 202 and 206. Thereby, the parasitic capacity formed between the signal wiring composed of the second electrode layer 205, and the lower electrode 207 of the semiconductor conversion element, the second n-type semiconductor layer 210 or the fifth electrode 211 can be lowered.

FIG. 7 is a sectional view taken along a 7—7 direction in FIG. 1, showing an example corresponding to the sectional view of FIG. 2. FIG. 7 is a sectional view at a position where the bias wiring composed of the fourth electrode layer 212 intersects the gate wiring composed of the first electrode 201. For reducing the capacity of the gate electrode, the first, the second and the third insulating films 202, 206 and 208 are formed on the gate wiring 201. The reason why the semiconductor layer 209 is further formed thereon is to arrange the semiconductor layer 209 in order to reduce the capacity applied to the gate wiring when a depleting bias of the semiconductor layer is applied to the gate wiring. Although only the first insulating layer 202 is arranged between the signal wiring composed of the second wiring 205 and the gate wiring, the signal wiring is configured to be protected by the second, the third and the fourth insulating layers 206, 208 and 213 in order not to be capacity-coupled with the electrodes arranged thereabout.

FIG. 8 is a simplified equivalent circuit diagram including a substrate and circuits arranged thereabout. Signal wiring 314 in the sensor substrate is connected to a signal processing circuit 315 arranged at an upper part. Gate wiring 313 is connected to a gate driver circuit unit 317 arranged at a left part. Moreover, bias wiring 310 is all bundled to one and is controlled by a common electrode bias control circuit unit 316 arranged at an upper part.

By controlling the gate driver circuit unit 317, the voltages of gate electrodes is controlled through the gate wiring 313 to control the turning on and off of the TFT's.

Moreover, the signal processing circuit unit 315 controls the gate driver circuit unit to operate the TFT's, and thereby reads the charges photoelectrically converted by the semiconductor conversion elements through the signal wiring to form an image.

The common electrode bias control circuit unit 316 controls the voltages applied to the semiconductor conversion elements, and thereby can, for example, select a depleting bias and a storage bias and change the voltage to be applied for controlling electric field strength at the time of applying a voltage especially to high resistance semiconductor layers in the semiconductor conversion elements. In particular, when the MIS type semiconductor element is used, it is needed to control the voltage after the reading of charges for removing the holes and the electrons stored in the interface between the insulating film and the high resistance semiconductor layer. The common electrode bias control circuit unit 316 performs the control of the voltage.

Two signal processing circuit units 315 may be arranged at upper and lower parts severally. Two gate driver circuit units 317 may be arranged on left and right sides severally. In case of arranging the signal processing circuit units at the upper and the lower parts, the signal wiring may be divided at, for example, the center, and the signals for the upper half may be controlled by the upper signal processing circuit unit, and further the signals for the lower half may be controlled by the lower signal processing circuit unit. In case of arranging the gate driver circuit units on the left and the right sides, the gate wiring may be divided at the center, or the gate wiring may be left in the connected state.

(Second Embodiment)

Figure 9:
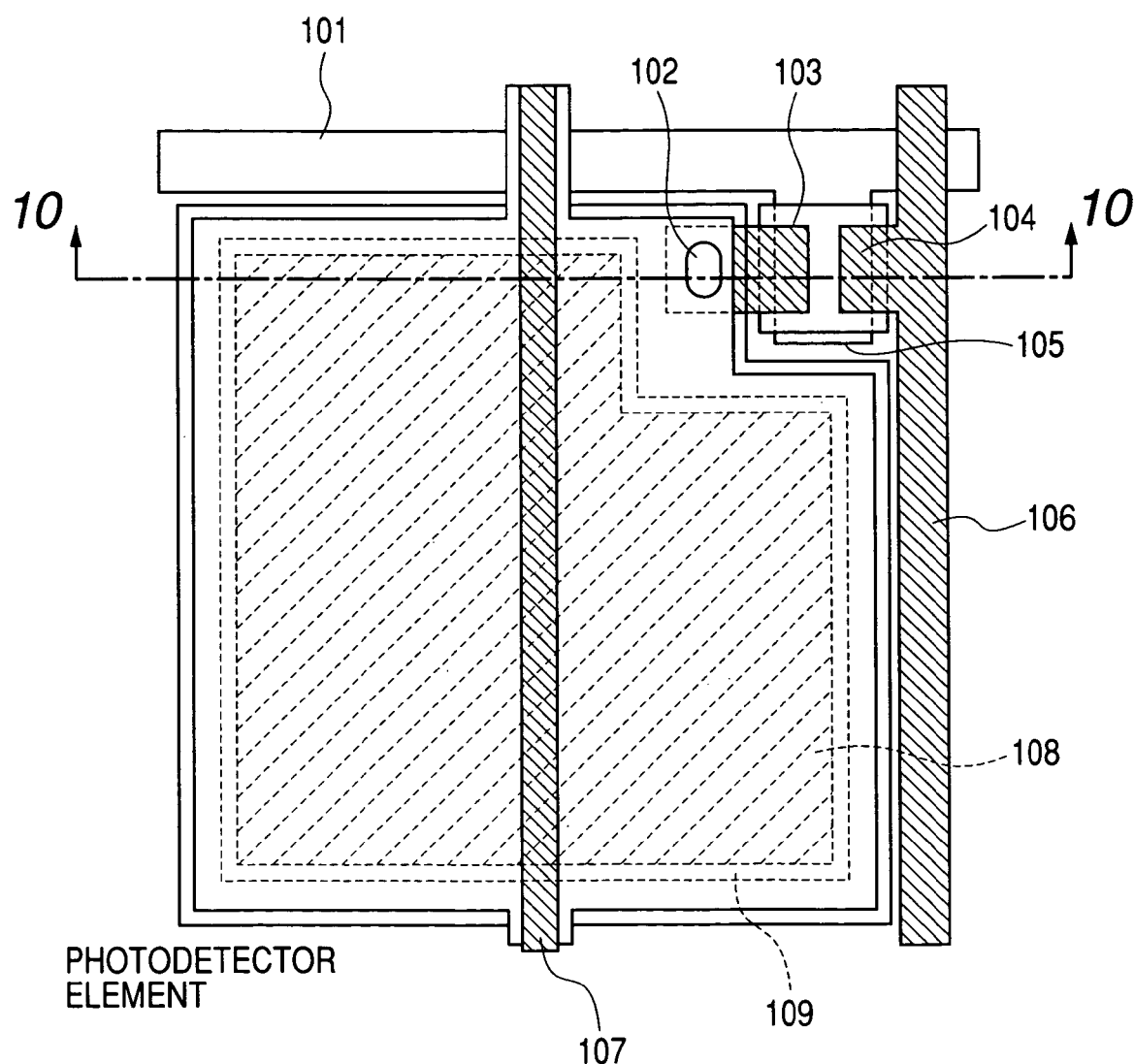
FIG. 9 is a plan view of a pixel according to a second embodiment of the present invention.

FIG. 9 is a layout diagram showing a plane configuration of a pixel in which a semiconductor conversion element and a TFT are paired in a radiation image pick-up apparatus according to a second embodiment of the present invention. The protection layer covering the TFT is not removed even at the parts on the signal wiring and the gate wiring to be left. The point different from the configuration in FIG. 1 of the first embodiment is that an etching stopper layer 109, which is exposed at the removal, is provided in a region where the removal region of the protection layer, or of the protection layer and the gate insulating layer of the TFT.

Figure 10:
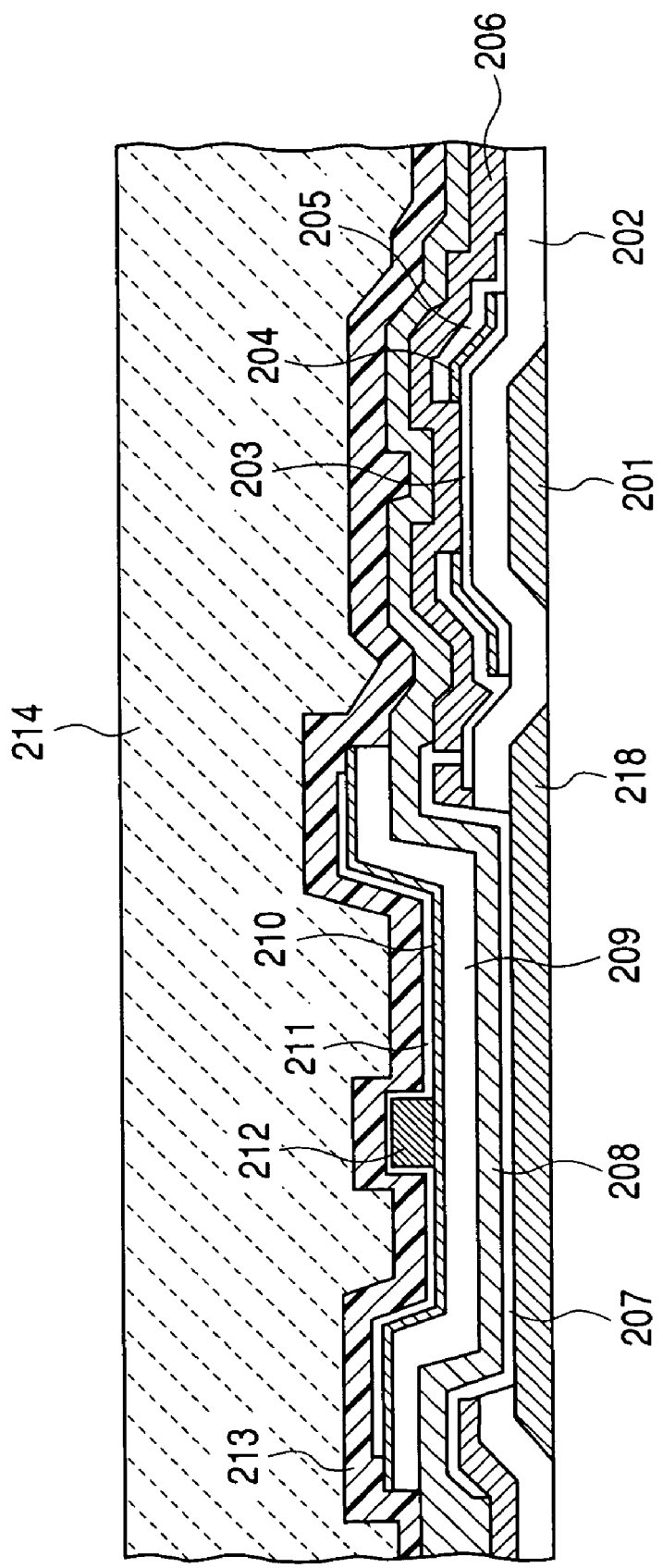
FIG. 10 is a sectional view taken along a line 10—10 in FIG. 9.

FIG. 10 is a sectional view taken along a line 10—10 in FIG. 9. The left half of the figure shows the semiconductor conversion element, and the right half of the figure shows the TFT. The semiconductor conversion element in the left half is the MIS type semiconductor conversion element composed of the third electrode layer 207, the third insulating layer 208, the second high resistance semiconductor layer 209, and the second n-type semiconductor layer 210 being an ohmic contact layer. The semiconductor conversion element can perform the photoelectric conversion of visible light. Similarly in FIG. 2, the protection layer composed of the second insulating layer 206 under the third electrode layer 207 of the semiconductor conversion element is removed. By removing the gate insulating layer of the TFT composed of the first insulating layer 202 at the same time, the further stress relaxation can be performed.

In case of forming the first insulating layer 202 and the second insulating layer 206 with an $SiO_2$ film, the $SiO_2$ film has a small dielectric constant, and the parasitic capacitance applied to the signal wiring and the gate wiring can be made to be small. In the case where the first insulating layer 202 and the second insulating layer 206 are formed of the $SiO_2$ film, the etching process for removing the first and the second insulating layers 202 and 206 is preferably performed by using the wet etching process using dilute fluorinated acid or buffered fluorinated acid.

When the first insulating layer 202 and the second insulating layer 206 are removed at the same time, the etching further proceeds even if the glass being the substrate is exposed. As a result, a remarkable step is produced in the semiconductor conversion element, and a large etching distribution is produced in the substrate. As the result, a distribution of capacitance applied to each semiconductor element is generated to be seen as an artifact on an image. Accordingly, it is preferable to arrange an electrode layer 218 of a metal layer such as Mo and Cr on the glass surface at the position where the first and the second insulating layers 202 and 206 are removed for providing an etching stopper layer at the time of etching with the dilute fluorinated acid or the buffered fluorinated acid. The metal layer 218 is formed at the same time as that of the gate electrode being the first electrode 201.

When only the protection layer composed of the second insulating layer is removed, it is preferable to arrange an electrode layer, which has been formed at the same time as that of the source electrode and the drain electrode compose of the second electrode layer in the protection layer removal region as an etching stopper layer.

As a result of the processes mentioned above, the parasitic capacity of each wiring can be relaxed and a radiation image pick-up apparatus having less noises can be provided. Moreover, the warping of a substrate owing to a film stress to cause a conveyance trouble and an absorption trouble of the substrate in a manufacturing process are prevented.

(Third Embodiment)

Figure 11:
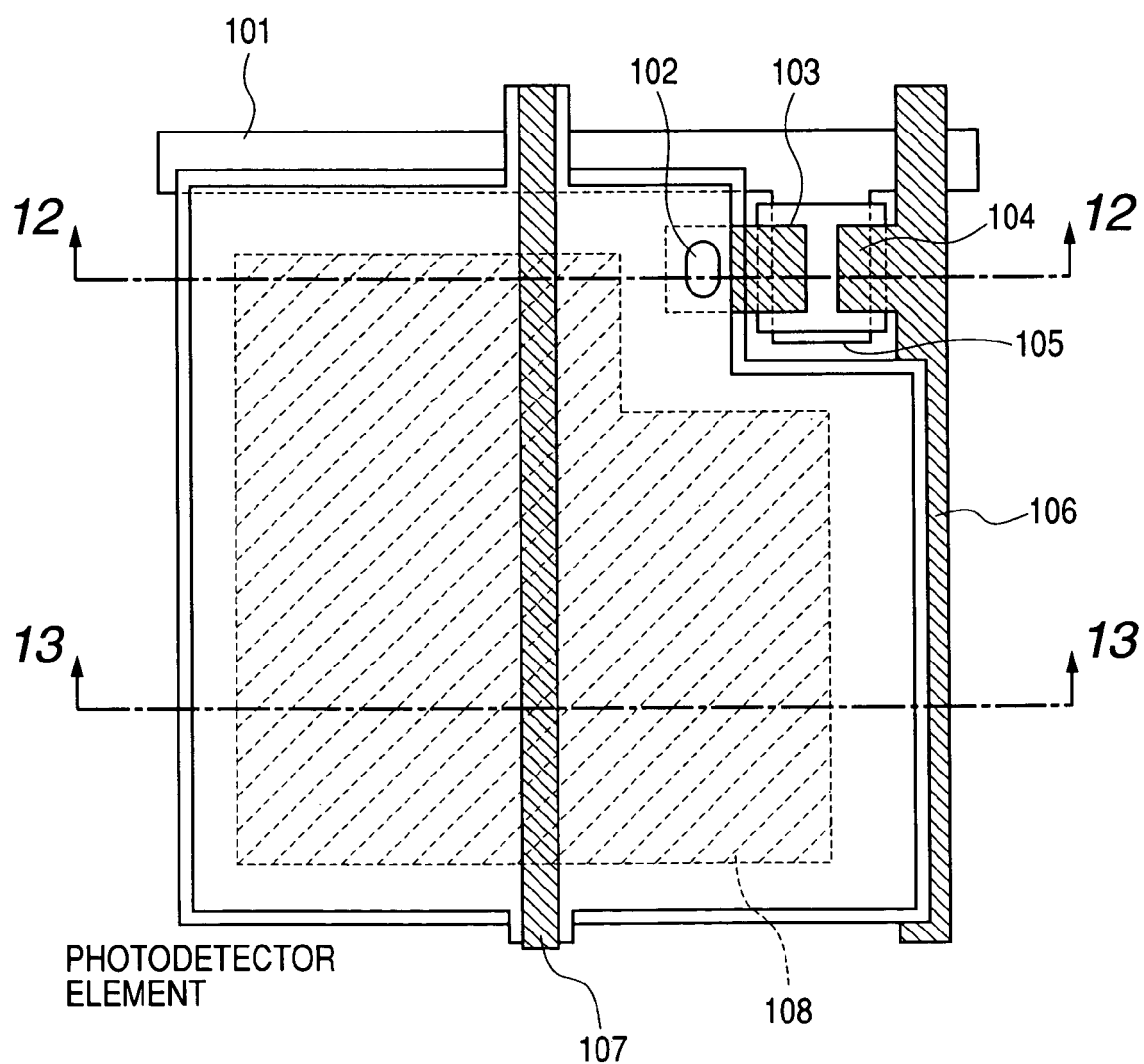
FIG. 11 is a plan view of a pixel according to a third embodiment of the present invention.

FIG. 11 is a layout diagram showing a plane configuration of a pixel in which a semiconductor conversion element and a TFT is paired in a radiation image pick-up apparatus according to a third embodiment of the present invention. The points different from the configuration in FIG. 1 of the first embodiment are that the semiconductor conversion element is stacked up to the upper part of signal wiring 106 and the gate wiring 101, and that a fifth insulating layer 219 is provided.

The reason why the semiconductor conversion layer is stacked on the signal wiring and the gate wiring is that the open area ratio of the semiconductor conversion element can be made to be large and thereby the sensitivity of the semiconductor conversion element can be made to be high. At this time, if the film thickness of the protection layer between the semiconductor conversion element and the signal wiring or the gate wiring is thin, capacity is generated between them. Consequently, even if the sensitivity of the sensor is heightened, for example, the noises of the sensor increase owing to the increase of signal wiring capacity, or the time constant of the gate wiring increases owing to the increase of the gate wiring capacity. However, when the film thickness of the protection layer is made to be sufficiently thick, the substrate warps owing to the stress of the film and then a conveyance error is caused. Accordingly, by forming the film thicknesses of the protection layers on the signal wiring and the gate wiring to be sufficiently thick, the capacity between the semiconductor conversion element and the signal wiring or the gate wiring can be suppressed to be small even if the semiconductor conversion element is arranged on the signal wiring or the gate wiring. By removing the protection layer covering a part of or the whole region in which the semiconductor conversion element is arranged, the stress relaxation can be performed and the warping of the substrate can be made to be small. Thereby, the substrate can be manufactured without causing any conveyance trouble.

Figure 12:
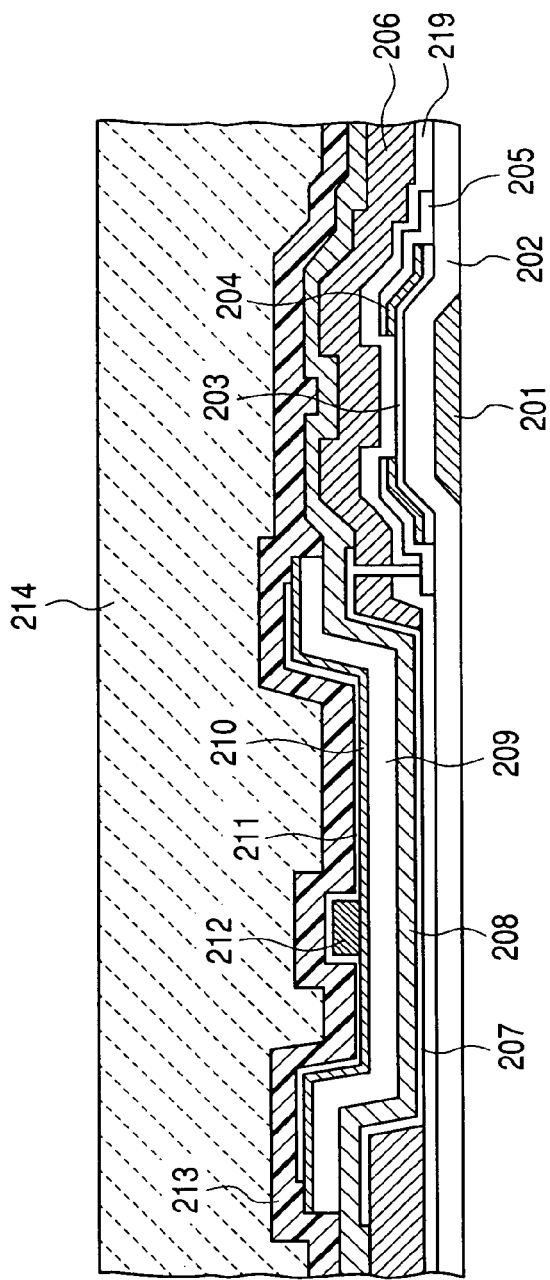
FIG. 12 is a sectional view taken along a line 12—12 in FIG. 11, showing an example using an MIS type semiconductor conversion element in case of not removing a second insulating layer in a protection layer to leave it, and of removing a third insulating layer for stress relaxation.

FIG. 12 is a sectional view taken along a line 12—12 in FIG. 11. The left half of the figure shows the semiconductor conversion element, and the right half of the figure shows the TFT. The semiconductor conversion element in the left half is the MIS type semiconductor conversion element composed of the third electrode layer 207, the third insulating layer 208, the second high resistance semiconductor layer 209, the second n-type semiconductor layer 210 being an ohmic contact layer, and the fourth electrode layer 212. The semiconductor conversion element can perform the photoelectric conversion of visible light. The protection layer for protecting the TFT unit has a two-layer configuration composed of the second insulating layer 206 and the fifth insulating layer 219. Similarly to FIG. 2, the protection layer composed of the second insulating layer 206 under the third electrode layer 207 of the semiconductor conversion element is removed. By not removing the protection layer composed of the fifth insulating layer 219 to be left by stopping etching at the time of etching, the first insulating layer 202 and the glass surface arranged under the fifth insulating layer 219 are not unstably etched, and it is also unnecessary to make the absolute step to be unnecessarily large. Consequently, stable work can be performed and at the same time the stress relaxation can be performed.

In case of forming the fifth insulating layer 219 with an $SiO_2$ film and of forming the second insulating layer 206 with an SiNx film, it is possible to etch only the second insulating layer 206 by dry etching and to leave the fifth insulating layer 219 without etching. After that, by etching only the through hole portion of the TFT portion by, for example, the WET etching to remove the fifth insulating layer 219, a hole for connecting the semiconductor conversion element with the TFT can be worked. Thereby, even if the SiNx film is used for the first insulating layer 202 being the gate insulating layer of the TFT similarly to the second insulating layer, the SiNx film can be left without being etched. Consequently, it is unnecessary to make the absolute step to be unnecessarily large, and stable work can be performed and at the same time the stress relaxation can be performed.

Figure 13:
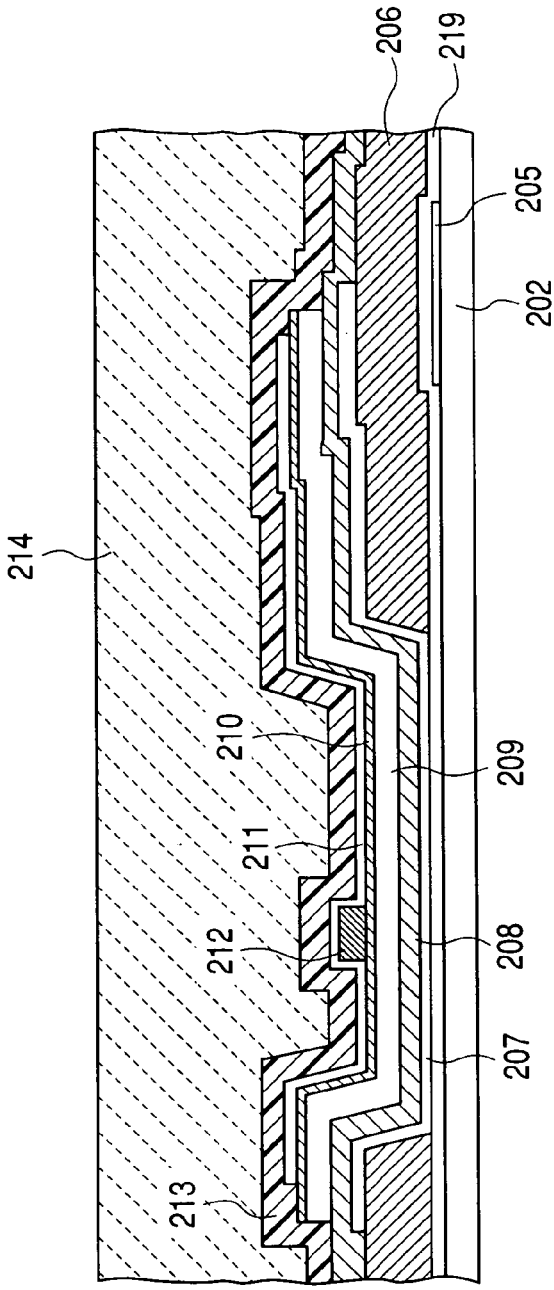
FIG. 13 is a sectional view taken along a line 13—13 in FIG. 11, showing an example using the MIS type semiconductor conversion element in case of not removing the second insulating layer in the protection layer to leave it, and of removing the third insulating layer for stress relaxation.

FIG. 13 is a sectional view taken along a line 13—13 in FIG. 11, showing an example corresponding to FIG. 12. The left half of the figure shows the semiconductor conversion element, and the right half of the figure shows the signal wiring. The semiconductor conversion element in the left half is the MIS type semiconductor conversion element composed of the third electrode layer 207, the third insulating layer 208, the second high resistance semiconductor layer 209, the second n-type semiconductor layer 210 being an ohmic contact layer, and the fourth electrode layer 212. The semiconductor conversion element can perform the photoelectric conversion of visible light. The insulating film for protecting the signal wiring has a two-layer configuration composed of the second insulating layer 206 and the fifth insulating layer 219. Similarly to FIG. 12, the protection layer composed of the second insulating layer 206 under the third electrode layer 207 of the semiconductor conversion element is removed. By not removing the protection layer composed of the fifth insulating layer 219 to be left by stopping etching at the time of etching, the first insulating layer 202 and the glass surface arranged under the fifth insulating layer 219 are not unstably etched, and it is also unnecessary to make the absolute step to be unnecessarily large. Consequently, stable work can be performed and at the same time the stress relaxation can be performed.

Figure 14:
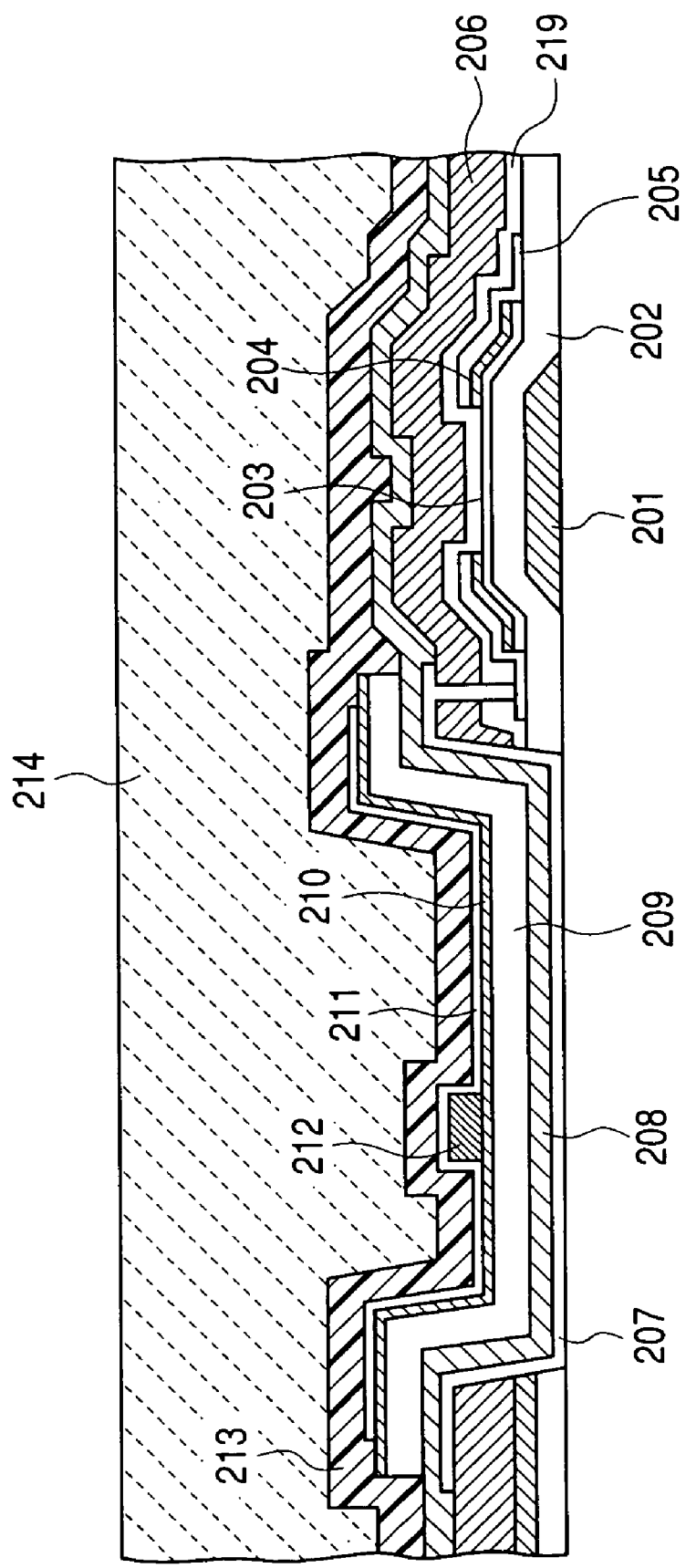
FIG. 14 is a sectional view taken along a line 14—14 in FIG. 11, showing an example using the MIS type semiconductor conversion element in case of removing all of the protection layer composed of a first, a second and a third insulating layers for stress relaxation.

FIG. 14 is a sectional view taken along a line 14—14 in FIG. 11, showing an example corresponding to FIG. 12. The left half of the figure shows the semiconductor conversion element, and the right half of the figure shows the TFT. The semiconductor conversion element in the left half is the MIS type semiconductor conversion element composed of the third electrode layer 207, the third insulating layer 208, the second high resistance semiconductor layer 209, the second n-type semiconductor layer 210 being an ohmic contact layer, and the fourth electrode layer 212. The semiconductor conversion element can perform the photoelectric conversion of visible light. The insulating film for protecting the TFT unit has a two-layer configuration composed of the second insulating layer 206 and the fifth insulating layer 219. The point different from the example shown in FIG. 12 is that both of the protection layers composed of both of the second and the fifth insulating layers 206 and 219 under the third electrode layer 207 of the semiconductor conversion element are removed. By using an $SiO_2$ film having a low dielectric constant as the second insulating layer 206 having a thick film thickness, the parasitic capacitance generated between the lower electrode of the semiconductor conversion element formed at the upper part and the signal wiring can be made to be small. By using the SiNx film as the fifth insulating layer 219 having a thin film thickness, the operation characteristics of the TFT show the characteristics of the SiNx film arranged at the immediately upper part of the TFT. Consequently, desired capacity designing and the operation characteristics of the TFT can be obtained.

By removing both of the protection layers, the stress of the substrate is relaxed, and the film thicknesses of the second and the fifth insulating layers can be increased. Thereby, the reduction of the parasitic capacitance can be achieved.

Figure 15:
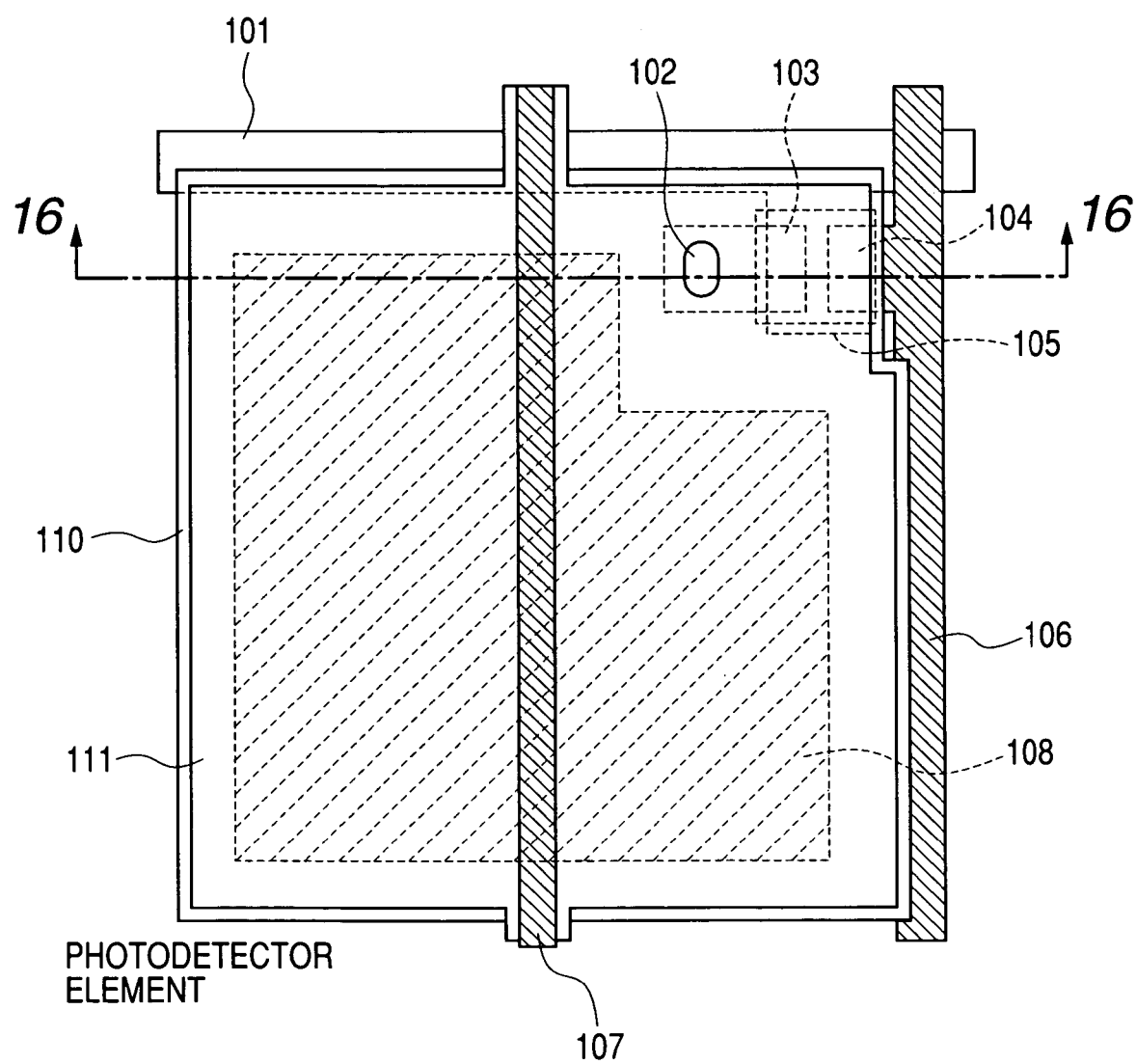
FIG. 15 is a plan view of a pixel according to the third embodiment of the present invention, which is different from FIG. 11.

FIG. 15 is a layout diagram showing a plane configuration different from that of FIG. 11. The plane configuration is one of a pixel in which a semiconductor conversion element and a TFT is paired in the radiation image pick-up apparatus according to the third embodiment of the present invention. The point different from the configuration in FIG. 11 is to be configured so that the semiconductor conversion element is stacked on the upper part of the TFT in addition to the gate wiring and the signal wiring. In FIG. 15, the reference numeral 110 denotes the lower electrode (corresponding to the electrode layer 207 in FIG. 16) of the semiconductor conversion element. A reference numeral 111 denotes the light receiving portion (corresponding to the second high resistor semiconductor layer 209 in FIG. 16) of the semiconductor conversion element.

The reason why the semiconductor conversion element is stacked on the gate wiring, the signal wiring and the TFT is that the open area ratio of the semiconductor conversion element is made to be large and thereby the sensitivity of the semiconductor conversion element can be made to be high. At this time, if the film thickness of the protection layer between the semiconductor conversion element and the TFT is thin, capacity is generated between them. Consequently, a backchannel effect is generated in the TFT owing to the charges stored in the semiconductor conversion element, and the off-current and the threshold voltage of the TFT are unstable. However, when the film thickness of the protection layer is made to be sufficiently thick and the capacity generated between the semiconductor conversion element and the TFT is reduced, the substrate warps owing to the stress of the film, and conveyance errors are caused. Accordingly, by forming the film thicknesses of the protection layers on the TFT and the gate wiring to be sufficiently thick, the capacity between the TFT and the semiconductor conversion element can be suppressed to be small even if the semiconductor conversion element is arranged on the TFT. By removing the protection layer of the TFT and the gate insulating layer, which cover a part of or the whole region in which the semiconductor conversion element is arranged, the stress relaxation can be performed and the warping of the substrate can be made to be small. Thereby, the substrate can be manufactured without causing any conveyance trouble.

Figure 16:
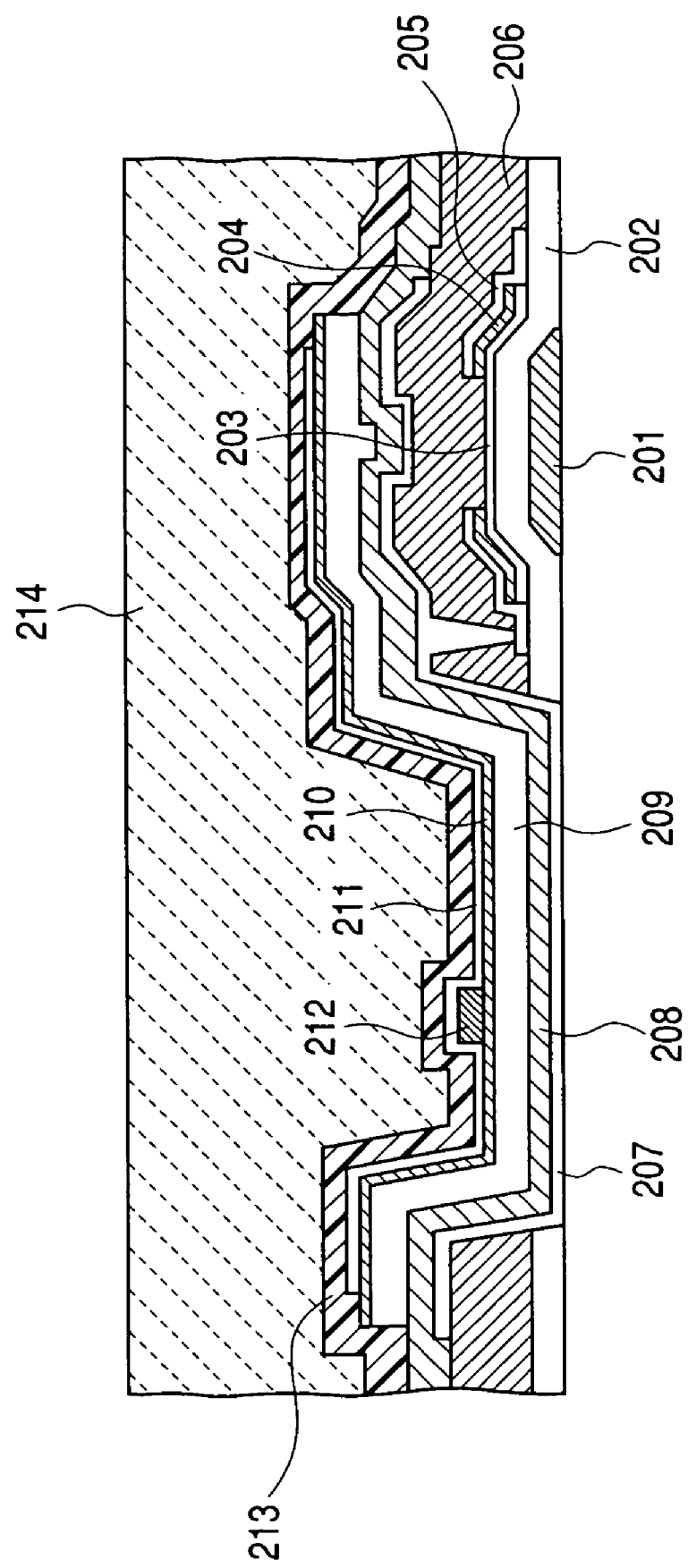
FIG. 16 is a sectional view taken along a line 16—16 in FIG. 15, showing an example using the MIS type semiconductor conversion element in case of removing the protection layer and the gate insulating layer for stress relaxation.

FIG. 16 is a sectional view taken along a line 16—16 in FIG. 15. The left half of the figure shows the semiconductor conversion element, and the right half of the figure shows the TFT. The semiconductor conversion element in the left half is the MIS type semiconductor conversion element composed of the third electrode layer 207, the third insulating layer 208, the second high resistance semiconductor layer 209, the second n-type semiconductor layer 210 being an ohmic contact layer, and the fourth electrode layer 212. The semiconductor conversion element can perform the photoelectric conversion of visible light. The point different from the configuration of FIG. 12 is that the semiconductor conversion element is arranged on the TFT. At this time, by using an $SiO_2$ film having a low dielectric constant as the second insulating layer, the parasitic capacitance generated between the lower electrode of the semiconductor conversion element formed at the upper part and the signal wiring can be made to be small. By removing both the protection layers by etching, the stress of the substrate is relaxed. Thereby, the film thickness of the second protection layer can be further thickened, and the reduction of the parasitic capacitance can be achieved.

Figure 17:
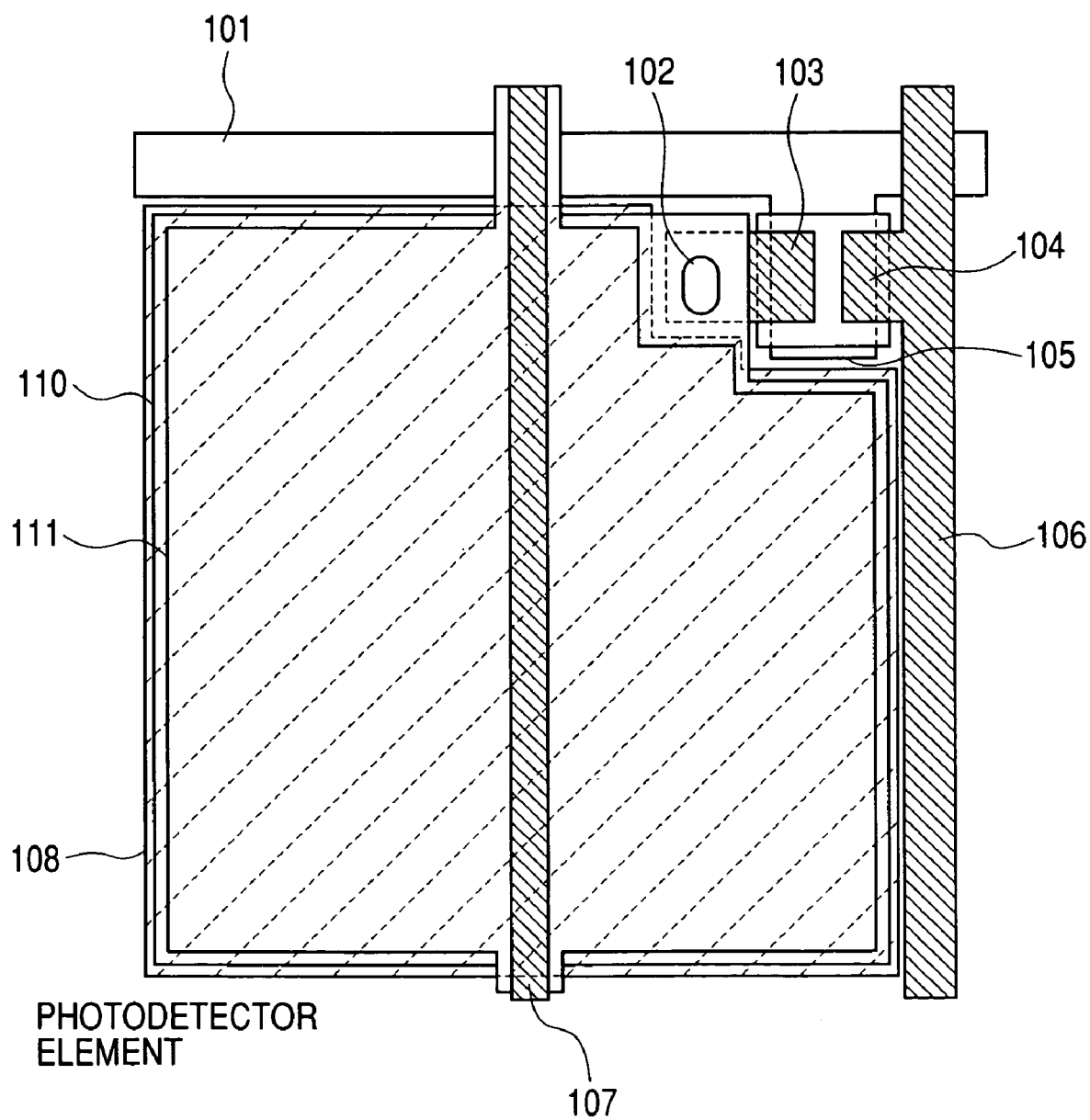
FIG. 17 is a plan view of a pixel according to the third embodiment of the present invention, which is different from FIGS. 11 and 15.

FIG. 17 is a layout diagram showing a plane configuration different from those of FIGS. 11 and 15. The plane configuration is one of a pixel in which a semiconductor conversion element and a TFT are paired in a radiation image pick-up apparatus according to the third embodiment of the present invention.

The different point is that the protection layer of the TFT and the gate insulating layer are removed is in the whole region of the semiconductor conversion element portion in which the lower electrode of the semiconductor conversion element and the semiconductor light receiving portion are superposed on each other, and thereby the stress relaxation is performed. Thereby, the warping of the substrate can be made to be small, and the substrate can be manufactured without causing any conveyance trouble. Because the whole semiconductor conversion element portion is removed, the step is removed in the semiconductor conversion element, and it is possible to provide a semiconductor conversion element having stable film coverage.

As a result of the configuration mentioned above, the parasitic capacity of each wiring can be relaxed and a radiation image pick-up apparatus having less noises can be provided. Moreover, the warping of a substrate owing to a film stress to cause a conveyance trouble and an absorption trouble of the substrate in a manufacturing process are prevented.

Figure 18A:
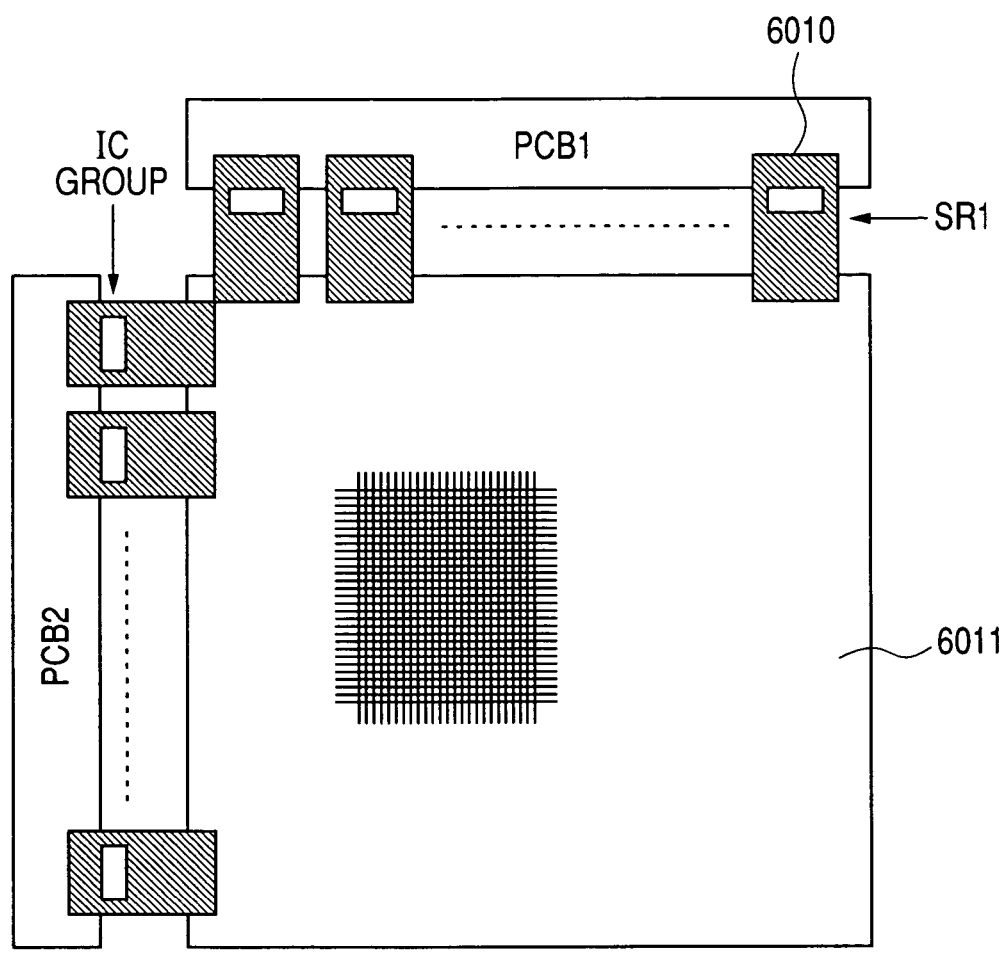
FIGS. 18A and 18B are schematic configuration view and a schematic sectional view, respectively, of packaging example of an X-ray image pick-up apparatus according to the present invention.
Figure 18B:
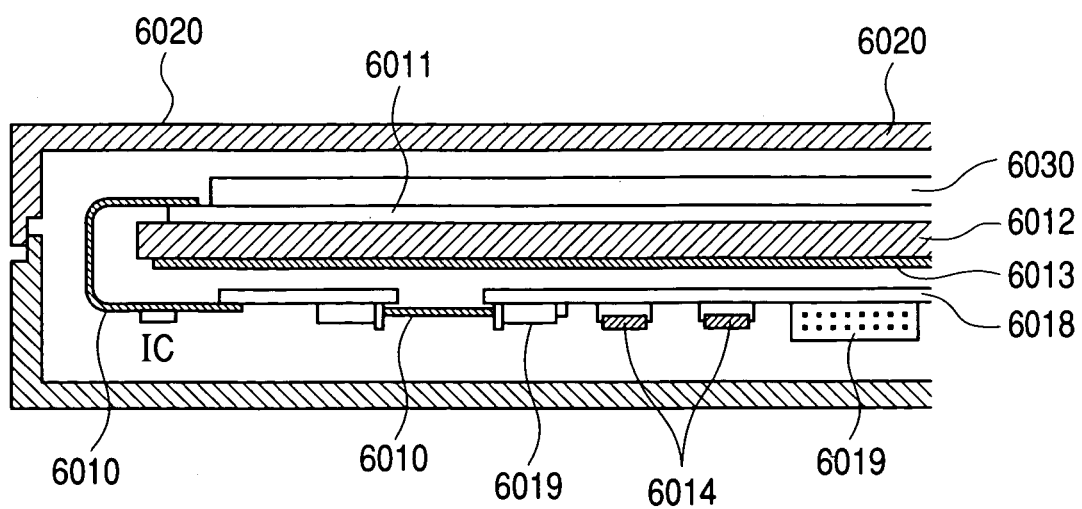

FIGS. 18A and 18B are schematic configuration view and a schematic sectional view, respectively, of a packaging example of a radiation (X-ray) image pick-up apparatus according to the present invention.

A plurality of photoelectric conversion elements and a plurality of TFT's are formed in a sensor substrate 6011. Flexible circuit boards 6010, on which shift registers SR1 and detecting integrated circuits IC are packaged, are connected to the sensor substrate 6011.

On reverse sides of the flexible circuit boards 6010, the flexible circuit boards 6010 are connected to circuit boards PCB1 and PCB2.

A plurality of sensor substrates 6011 is adhered to a base 6012 to constitute a large sized photoelectric conversion apparatus. A lead plate for protecting memories 6014 in a processing circuit 6018 from X-rays is packaged under the base 6012. A scintillator (phosphor layer) 6030 such as CsI for converting an X-ray to visible light is evaporated on the sensor substrate 6011. As shown in FIG. 18B, the whole is housed in a case 6020 made of carbon fibers.

Figure 19:
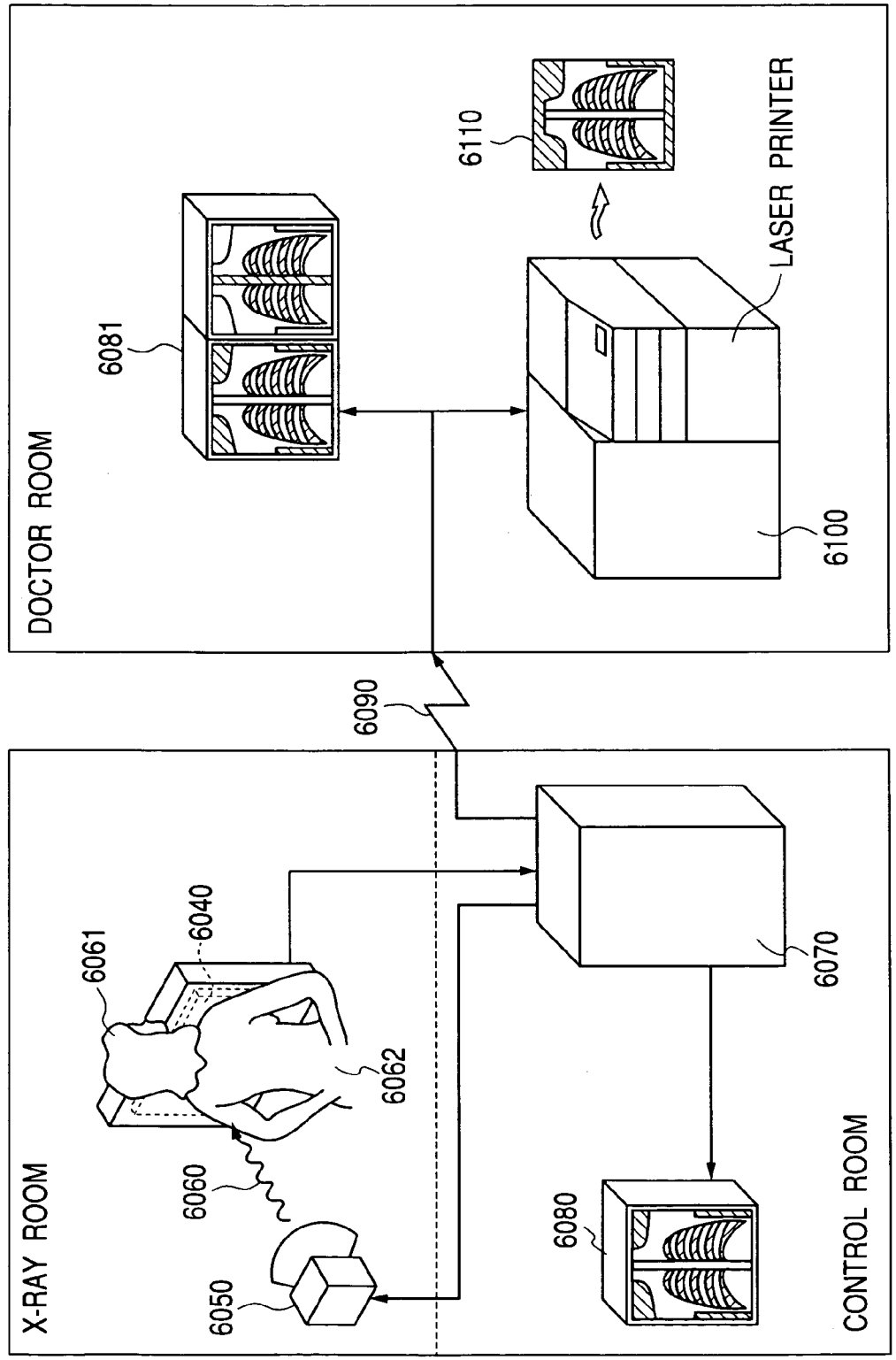
FIG. 19 is a view showing an application example of an X-ray detecting apparatus according to the present invention to an X-ray diagnostic system.
Figure 20:
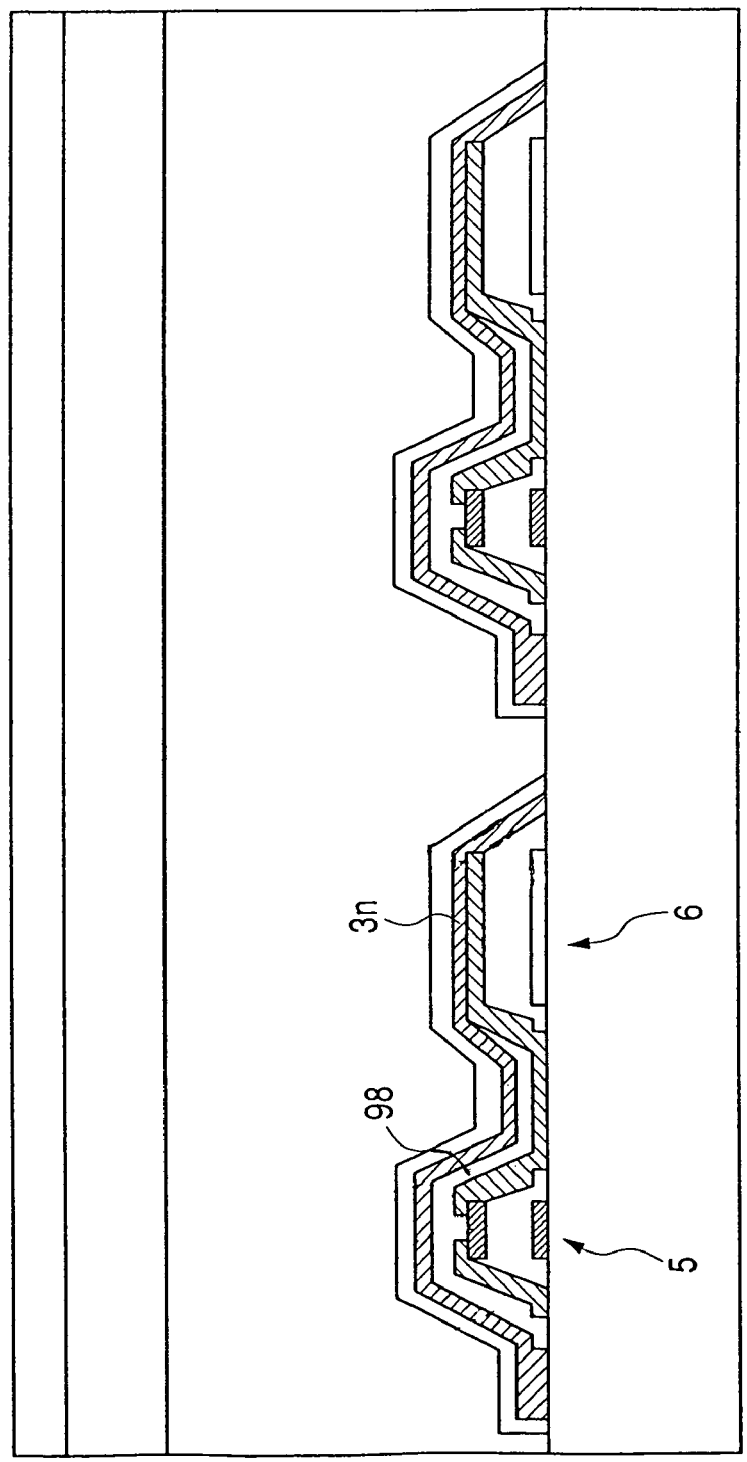
FIG. 20 is a sectional view of a pixel pertaining to prior art.
Figure 21:
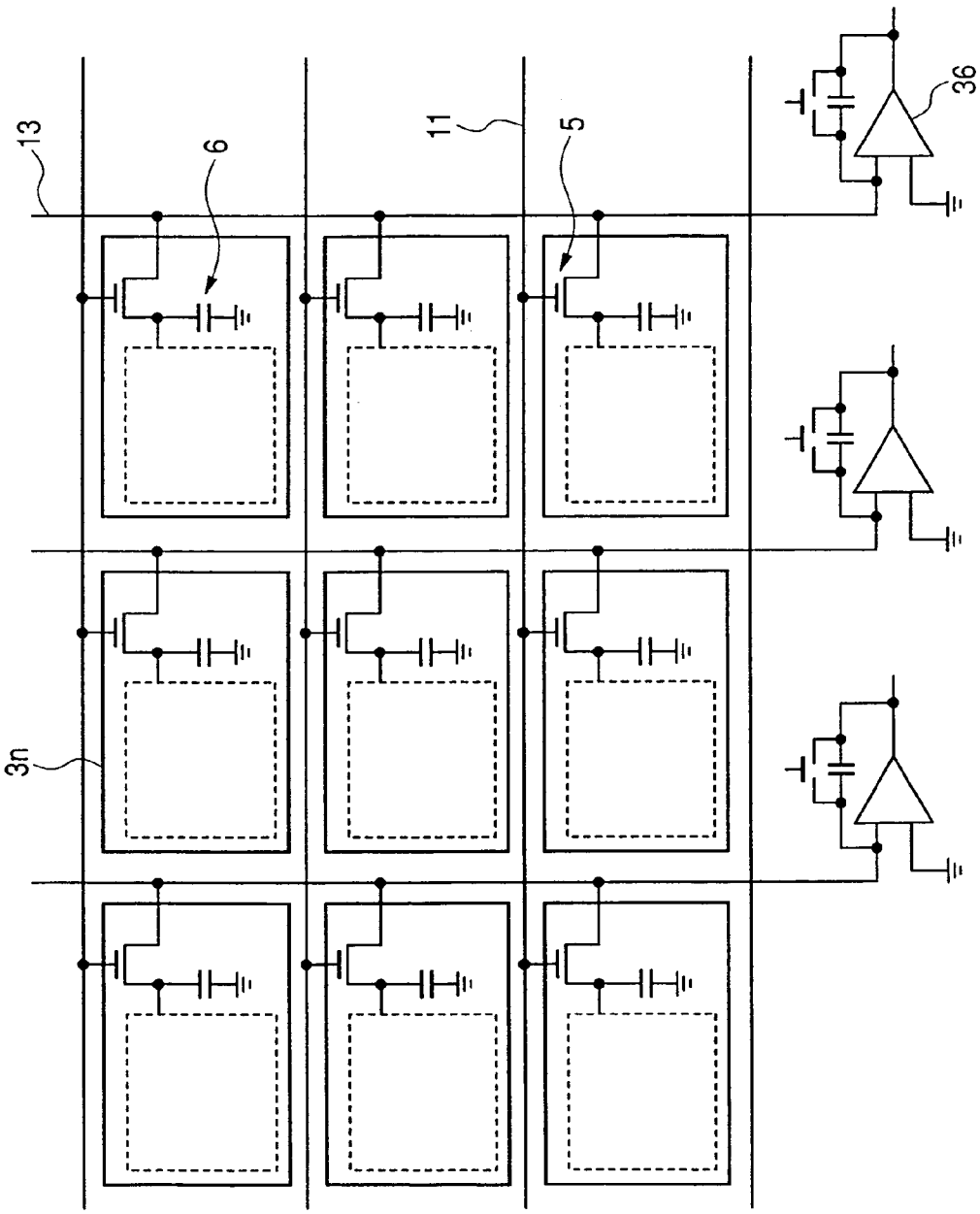
FIG. 21 is a view showing a plane configuration of pixels arranged in a matrix and a simplified equivalent circuit pertaining to the prior art.

FIG. 19 shows an application example of the X-ray detection apparatus of the present invention to an X-ray diagnostic system.

An X-ray 6060 generated by an X-ray tube 6050 transmits the chest 6062 of a patient or a subject 6061, and enters a photoelectric conversion apparatus 6040 packaging a scintillator at its upper part (the photoelectric conversion apparatus packaging the scintillator constitutes the radiation image pick-up apparatus). The entered X-ray includes the information of the inside of the body of the patient 6061. The scintillator emits light correspondingly to the entering of the X-ray. The emitted light is photoelectrically converted to be obtained as an electric signal. The information is converted to digital information, and the image processing of the information is performed by an image processor 6070 as signal processing means. The processed image can be observed by a display 6080 as display means in a control room.

Moreover, the information can be transferred to a remote place by means of transmission processing means such as a telephone line 6090 or the like. The transferred data can be displayed on a display 6081 as display means in a doctor room or the like at another place, or can be stored in a recording medium such as an optical disk. Thus, the information can be diagnosed by a doctor at the remote place. Moreover, the information can be recorded in a film 6110 as a recording medium by a film processor 6100 as recording means.

The present invention can be applied to a detection apparatus of a radiation such as an X-ray for medical use or nondestructive testing. Moreover, the present invention can be applied to an image pick-up apparatus for converting light such as visible light to an electric signal, especially to an image pick-up apparatus having a large scaled photoelectric conversion region.

As many apparently widely different embodiments of the present invention can be made without departing from the spirit and scope thereof, it is to be understood that the invention is not limited to the specific embodiments thereof except as defined in the claims.

This application claims priority from Japanese Patent Application Nos. 2003-344560 filed Oct. 2, 2003 and 2004-175558 filed Jun. 14, 2004, both of which are hereby incorporated by reference herein.

What is claimed is:

1. An image pick-up apparatus in which a plurality of pixels, each comprising a pair of a semiconductor conversion elements for converting an incident electromagnetic wave to an electric signal and a thin film transistor connected to said semiconductor conversion element, is arranged in a two-dimensional manner on a substrate, said image pick-up apparatus including gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on said substrate, wherein a protection layer is arranged so as to cover said thin film transistors, said gate wiring and said signal wiring, and the protection layer is removed from at least a part or whole of a region in which a through hole and the semiconductor conversion element are formed, further comprising insulating layers under said protection layer, said insulating layers formed at the same time as that of gate insulating layers of said thin film transistors, wherein said insulating layers are removed similarly to said protection layer in at least parts of or all of said regions in which said semiconductor conversion elements are formed.

2. An image pick-up apparatus in which a plurality of pixels, each comprising a pair of a semiconductor conversion elements for converting an incident electromagnetic wave to an electric signal and a thin film transistor connected to said semiconductor conversion element, is arranged in a two-dimensional manner on a substrate, said image pick-up apparatus including gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on said substrate, wherein a protection layer is arranged so as to cover said thin film transistors, said gate wiring and said signal wiring, and the protection layer is removed from at least a part or whole of a region in which a through hole and the semiconductor conversion element are formed, wherein each of said semiconductor conversion elements includes at least two electrode layers of a lower electrode layer and an upper electrode layer, and each of other ends of said source electrodes and said drain electrodes is connected to said lower electrode, and said lower electrode is arranged astride on at least a part of said protection layer and each of the regions in which said protection layer is removed, and wherein all of ends of said lower electrode layer after patterning are arranged on said protection layer.

3. An image pick-up apparatus, in which a plurality of pixels, each comprising a pair of a semiconductor conversion elements for converting an incident electromagnetic wave to an electric signal and a thin film transistor connected to said semiconductor conversion element, is arranged in a two-dimensional manner on a substrate, said image pick-up apparatus including gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on said substrate, wherein a protection layer is arranged so as to cover said thin film transistors, said gate wiring and said signal wiring, and the protection layer is removed from at least a part or whole of a region in which a through hole and the semiconductor conversion element are formed and, wherein said protection layer has a multilayer configuration composed of a plurality of kinds selected from the group consisting of an $SiO_2$ film, an SiNx film and an SiON film.

4. An image pick-up apparatus, in which a plurality of pixels, each comprising a pair of a semiconductor conversion elements for converting an incident electromagnetic wave to an electric signal and a thin film transistor connected to said semiconductor conversion element, is arranged in a two-dimensional manner on a substrate, said image pick-up apparatus including gate wiring to which gate electrodes of thin film transistors of a plurality of pixels arranged in one direction are commonly connected, and signal wiring to which source electrodes or drain electrodes of thin film transistors of a plurality of pixels arranged in a direction different from the one direction are commonly connected on said substrate, wherein a protection layer is arranged so as to cover said thin film transistors, said gate wiring and said signal wiring, and the protection layer is removed from at least a part or whole of a region in which a through hole and the semiconductor conversion element are formed, wherein each of said semiconductor conversion elements is an MIS type semiconductor element including an insulating layer, a high resistance semiconductor layer, an ohmic contact layer, and electrode layers arranged at an upper part and a lower part, and wherein said ohmic contact layer is also used as one of said electrode layers of each of said semiconductor conversion elements.

5. A radiation image pick-up apparatus including an image pick-up apparatus according to one of claims 1, 2, 3 and 4, wherein said semiconductor conversion elements of said image pick-up apparatus are photoelectric conversion elements, and the electromagnetic wave is a radiation, and said radiation image pick-up apparatus includes wavelength conversion layers for converting the radiation to light having a wavelength in a wavelength region in which the light can be photoelectrically converted by said photoelectric conversion elements, said wavelength conversion layers being formed on said photoelectric conversion elements severally.

6. A radiation image pick-up system, comprising:

a radiation image pick-up apparatus according to claim 5;

signal processing means for processing a signal from said radiation image pick-up apparatus;

recording means for recording a signal from said signal processing means;

display means for displaying the signal from said signal processing means;

transmission processing means for transmitting the signal from said signal processing means; and a radiation source for generating a radiation.

7. A radiation image pick-up apparatus including an image pick-up apparatus according to one of claims 1, 2, 3 and 4, wherein said semiconductor conversion elements of said image pick-up apparatus are elements for converting a radiation to an electric signal directly, and the electromagnetic wave is the radiation.

\* \* \* \* \*

UNITED STATES PATENT AND TRADEMARK OFFICE
CERTIFICATE OF CORRECTION

| | |
|---|---|
| PATENT NO. | : 7,126,127 B2 |
| APPLICATION NO. | : 10/954194 |
| DATED | : October 24, 2006 |
| INVENTOR(S) | : Watanabe et al. |

It is certified that error appears in the above-identified patent and that said Letters Patent is hereby corrected as shown below:

ON THE TITLE PAGE [57] ABSTRACT:

Line 14, "formed" should read --are formed--.

COLUMN 2:

Line 10, "the wiring." should read --wirings.--;
Line 39, "is are" should read --is--; and
Line 61, "waver" should read --wave--.

COLUMN 3:

Line 55, "achieve" should read --achieved--;
Line 67, "an ray, a ray, a ray" should read --an α ray, a β ray, a γ ray--.

COLUMN 5:

Line 13, "schematic" should read --a schematic--.

COLUMN 6:

Line 22, "two-dimension" should read --two-dimensional--; and
Line 67, "versions" should read --version--.

COLUMN 9:

Line 10, "FIG. 2," should read --FIG. 1,--;
Line 16, "to" should read --for--;
Line 17, "can be" should read --to be--; and
Line 37, "7-7 direction" should read --7-7 line--.

COLUMN 11:

Line 20, "compose" should read --composed--.

UNITED STATES PATENT AND TRADEMARK OFFICE
CERTIFICATE OF CORRECTION

PATENT NO. : 7,126,127 B2
APPLICATION NO. : 10/954194
DATED : October 24, 2006
INVENTOR(S) : Watanabe et al.

It is certified that error appears in the above-identified patent and that said Letters Patent is hereby corrected as shown below:

COLUMN 14:

Line 56, "schematic" should read --a schematic--.

COLUMN 15:

Line 2, "large sized" should read --large-sized--; and
　　Line 42, "large scaled" should read --large-scale--.

This certificate supersedes the Certificate of Correction issued June 17, 2008.

Signed and Sealed this

Twenty-second Day of July, 2008

JON W. DUDAS
*Director of the United States Patent and Trademark Office*